United States Patent
Gosavi et al.

(10) Patent No.: US 11,476,412 B2
(45) Date of Patent: Oct. 18, 2022

(54) PERPENDICULAR EXCHANGE BIAS WITH ANTIFERROMAGNET FOR SPIN ORBIT COUPLING BASED MEMORY

(71) Applicant: Intel Corporation, Santa Clara, CA (US)

(72) Inventors: Tanay Gosavi, Hillsboro, OR (US); Sasikanth Manipatruni, Portland, OR (US); Kaan Oguz, Portland, OR (US); Noriyuki Sato, Hillsboro, OR (US); Kevin O'Brien, Portland, OR (US); Benjamin Buford, Hillsboro, OR (US); Christopher Wiegand, Portland, OR (US); Angeline Smith, Hillsboro, OR (US); Tofizur Rahman, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 850 days.

(21) Appl. No.: 16/012,672

(22) Filed: Jun. 19, 2018

(65) Prior Publication Data
US 2019/0386205 A1 Dec. 19, 2019

(51) Int. Cl.
*H01L 43/04* (2006.01)
*H01L 43/10* (2006.01)
(Continued)

(52) U.S. Cl.
CPC ............ *H01L 43/04* (2013.01); *G11C 11/161* (2013.01); *G11C 11/18* (2013.01);
(Continued)

(58) Field of Classification Search
CPC ......... H01L 43/04; H01L 43/08; H01L 43/10; G11C 11/161; G11C 11/18; H01F 10/3286; B82Y 25/00
(Continued)

(56) References Cited

U.S. PATENT DOCUMENTS 6,057,049 A  5/2000 Fuke et al.
6,965,138 B2 11/2005 Nakajima et al.
(Continued)

FOREIGN PATENT DOCUMENTS

CN  105161613     12/2015
WO  2016048248    3/2016
(Continued)

OTHER PUBLICATIONS

Cubukcu, Murat, et al., "Spin-orbit torque magnetization switching of a three-terminal perpendicular magnetic tunnel junction", Applied Physics Letters 104, 2014, 5 pgs.
(Continued)

*Primary Examiner* — Jami Valentine Miller
(74) *Attorney, Agent, or Firm* — Essential Patents Group, LLP

(57) ABSTRACT

An apparatus is provided which comprises: a magnetic junction including: a first structure comprising a magnet with an unfixed perpendicular magnetic anisotropy (PMA) relative to an x-y plane of a device; a second structure comprising one of a dielectric or metal; a third structure comprising a magnet with fixed PMA, wherein the third structure has an anisotropy axis perpendicular to the plane of the device, and wherein the third structure is adjacent to the second structure such that the second structure is between the first and third structures; a fourth structure comprising an antiferromagnetic (AFM) material, the fourth structure adjacent to the third structure; a fifth structure comprising a magnet with PMA, the fifth structure adjacent to the fourth structure; and an interconnect adjacent to the first structure, the interconnect comprising spin orbit material.

20 Claims, 17 Drawing Sheets

(51) Int. Cl.
*H01L 43/08* (2006.01)
*G11C 11/16* (2006.01)
*G11C 11/18* (2006.01)
*H01F 10/32* (2006.01)
*B82Y 25/00* (2011.01)

(52) U.S. Cl.
CPC ......... *H01F 10/3286* (2013.01); *H01L 43/08* (2013.01); *H01L 43/10* (2013.01); *B82Y 25/00* (2013.01)

(58) Field of Classification Search
USPC ...................................................... 257/421
See application file for complete search history.

(56) References Cited

U.S. PATENT DOCUMENTS

| | | |
|---|---|---|
| 7,098,495 B2 | 8/2006 | Sun et al. |
| 7,538,402 B2 | 5/2009 | Fukumoto |
| 8,018,011 B2 | 9/2011 | Ranjan et al. |
| 8,159,870 B2 | 4/2012 | Xia |
| 8,169,821 B1 | 5/2012 | Ranjan et al. |
| 8,476,722 B2 | 7/2013 | Lee |
| 8,482,970 B2 | 7/2013 | Dimitrov |
| 9,251,883 B2 | 2/2016 | Wu et al. |
| 9,324,402 B2 | 4/2016 | Wu et al. |
| 10,276,784 B1 | 4/2019 | Yu et al. |
| 10,283,701 B1 | 5/2019 | Ikhtiar et al. |
| 10,340,445 B2 | 7/2019 | Oguz et al. |
| 10,453,510 B2 | 10/2019 | Park et al. |
| 10,522,740 B2 | 12/2019 | Chuang et al. |
| 10,749,104 B2 | 8/2020 | Liu et al. |
| 10,916,284 B2 | 2/2021 | Le et al. |
| 2004/0125673 A1 | 7/2004 | Daughton et al. |
| 2004/0150017 A1 | 8/2004 | Tsang |
| 2004/0211963 A1 | 10/2004 | Garni et al. |
| 2005/0174836 A1 | 8/2005 | Sharma et al. |
| 2005/0247964 A1 | 11/2005 | Pietambaram et al. |
| 2005/0285168 A1 | 12/2005 | Worledge et al. |
| 2007/0063237 A1 | 3/2007 | Huai et al. |
| 2007/0183187 A1 | 8/2007 | Guo |
| 2008/0273375 A1 | 11/2008 | Dahmani et al. |
| 2009/0166773 A1 | 7/2009 | Ohno et al. |
| 2010/0090300 A1 | 4/2010 | Xi et al. |
| 2010/0172173 A1 | 7/2010 | Abu-Rahma et al. |
| 2012/0126905 A1 | 5/2012 | Zhang et al. |
| 2012/0163070 A1 | 6/2012 | Nagase et al. |
| 2012/0250398 A1 | 10/2012 | Morise et al. |
| 2012/0267733 A1 | 10/2012 | Hu et al. |
| 2013/0001506 A1 | 1/2013 | Sato et al. |
| 2013/0001652 A1 | 1/2013 | Yoshikawa et al. |
| 2013/0099780 A1 | 4/2013 | Ma et al. |
| 2013/0299929 A1 | 11/2013 | Watanabe et al. |
| 2013/0336045 A1 | 12/2013 | Kuo et al. |
| 2014/0021426 A1 | 1/2014 | Lee et al. |
| 2014/0056060 A1 | 2/2014 | Khvalkovskiy et al. |
| 2014/0070341 A1 | 3/2014 | Beach et al. |
| 2014/0084398 A1 | 3/2014 | Oguz et al. |
| 2014/0084938 A1 | 3/2014 | Lai et al. |
| 2014/0145792 A1 | 5/2014 | Wang et al. |
| 2014/0175574 A1 | 6/2014 | Watts et al. |
| 2014/0175582 A1 | 6/2014 | Apalkov et al. |
| 2014/0269035 A1 | 9/2014 | Manipatruni et al. |
| 2014/0269036 A1 | 9/2014 | Pi et al. |
| 2014/0306302 A1 | 10/2014 | Guenole et al. |
| 2014/0312441 A1 | 10/2014 | Guo |
| 2015/0001655 A1 | 1/2015 | Sun et al. |
| 2015/0008547 A1 | 1/2015 | Pi et al. |
| 2015/0035095 A1 | 2/2015 | Kim et al. |
| 2015/0041934 A1 | 2/2015 | Khvalkovskiy et al. |
| 2015/0061020 A1 | 3/2015 | Yokoyama et al. |
| 2015/0076633 A1 | 3/2015 | Siddik et al. |
| 2015/0171316 A1 | 6/2015 | Park et al. |
| 2015/0213866 A1 | 7/2015 | Wu et al. |
| 2016/0079518 A1 | 3/2016 | Pi et al. |
| 2016/0155932 A1 | 6/2016 | Chen et al. |
| 2016/0163965 A1 | 6/2016 | Han et al. |
| 2016/0225423 A1 | 8/2016 | Naik et al. |
| 2016/0300612 A1 | 10/2016 | Manipatruni et al. |
| 2017/0069827 A1 | 3/2017 | Lee et al. |
| 2017/0076769 A1 | 3/2017 | Shirotori et al. |
| 2017/0092848 A1 | 3/2017 | Jang et al. |
| 2017/0125078 A1 | 5/2017 | Mihajlovic et al. |
| 2017/0148978 A1 | 5/2017 | Apalkov et al. |
| 2017/0178705 A1 | 6/2017 | Buhrman et al. |
| 2017/0222135 A1 | 8/2017 | Fukami et al. |
| 2018/0061887 A1 | 3/2018 | Braganca |
| 2018/0066375 A1 | 3/2018 | Morgan et al. |
| 2018/0076384 A1 | 3/2018 | Gan et al. |
| 2018/0083067 A1 | 3/2018 | Kim et al. |
| 2018/0114898 A1 | 4/2018 | Lee |
| 2018/0123027 A1 | 5/2018 | Yamane et al. |
| 2018/0123028 A1 | 5/2018 | Shiokawa et al. |
| 2018/0130943 A1 | 5/2018 | Naik et al. |
| 2018/0158588 A1 | 6/2018 | Manipatruni et al. |
| 2018/0175286 A1 | 6/2018 | Sato et al. |
| 2018/0219152 A1 | 8/2018 | Apalkov et al. |
| 2018/0233187 A1 | 8/2018 | Lim et al. |
| 2018/0240970 A1 | 8/2018 | Oguz et al. |
| 2018/0248113 A1 | 8/2018 | Pinarbasi et al. |
| 2018/0248114 A1 | 8/2018 | Oguz et al. |
| 2018/0248115 A1 | 8/2018 | Oguz et al. |
| 2018/0308536 A1 | 10/2018 | Buhrman et al. |
| 2018/0374526 A1 | 12/2018 | Lee et al. |
| 2019/0006414 A1 | 1/2019 | Huai et al. |
| 2019/0043548 A1 | 2/2019 | Park et al. |
| 2019/0057731 A1 | 2/2019 | Lua et al. |
| 2019/0079701 A1* | 3/2019 | Rakshit ................ G11C 11/18 |
| 2019/0081234 A1 | 3/2019 | Naik et al. |
| 2019/0123098 A1 | 4/2019 | Sun et al. |
| 2019/0165253 A1 | 5/2019 | Sun et al. |
| 2019/0244651 A1 | 8/2019 | Shiokawa et al. |
| 2019/0252601 A1 | 8/2019 | Chatterjee et al. |
| 2019/0267540 A1 | 8/2019 | Shiokawa |
| 2019/0272863 A1* | 9/2019 | Jung ...................... H01L 43/02 |
| 2019/0287589 A1 | 9/2019 | Buyandalai et al. |
| 2019/0304522 A1 | 10/2019 | Tahmasebi et al. |
| 2019/0304524 A1 | 10/2019 | Oguz et al. |
| 2019/0304525 A1* | 10/2019 | Manipatruni ........... H01L 43/08 |
| 2019/0304653 A1 | 10/2019 | Oguz et al. |
| 2019/0305212 A1* | 10/2019 | Gosavi ................. G11C 11/1675 |
| 2019/0305216 A1* | 10/2019 | Gosavi ..................... H01L 43/02 |
| 2019/0305217 A1 | 10/2019 | Xue et al. |
| 2019/0326353 A1* | 10/2019 | O'Brien ............... H01F 10/3254 |
| 2019/0386205 A1* | 12/2019 | Gosavi ..................... H01L 43/04 |
| 2019/0386209 A1 | 12/2019 | Smith et al. |
| 2019/0386662 A1 | 12/2019 | Lin et al. |
| 2020/0006424 A1 | 1/2020 | Sato et al. |
| 2020/0006626 A1 | 1/2020 | Smith et al. |
| 2020/0006628 A1* | 1/2020 | O'Brien ..................... H01L 43/08 |
| 2020/0013444 A1 | 1/2020 | Min et al. |
| 2020/0035282 A1* | 1/2020 | Lee ..................... H01F 10/3259 |
| 2020/0083286 A1* | 3/2020 | Manipatruni ......... G11C 11/161 |
| 2020/0083427 A1* | 3/2020 | Manipatruni ......... H01F 10/324 |
| 2020/0098410 A1* | 3/2020 | Gosavi ..................... H01L 43/12 |
| 2020/0105998 A1* | 4/2020 | Smith .................. G11C 11/1675 |
| 2020/0227104 A1* | 7/2020 | Rahman ................. G11C 11/18 |
| 2020/0235289 A1 | 7/2020 | Alam et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0312907 A1 | 10/2020 | Ouellette et al. |
| 2020/0313084 A1 | 10/2020 | Ouellette et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0012940 A1* | 1/2021 | Salahuddin ............. H01L 43/06 |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |

(56) References Cited

U.S. PATENT DOCUMENTS

| | | |
|---|---|---|
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |
| 2021/0303981 A1 | 9/2021 | Sasaki et al. |
| 2021/0367142 A1 | 11/2021 | Lee et al. |
| 2022/0068538 A1 | 3/2022 | Apalkov et al. |
| 2022/0131067 A1 | 4/2022 | Kalitsov et al. |

FOREIGN PATENT DOCUMENTS

| | | |
|---|---|---|
| WO | 2016209272 | 12/2016 |
| WO | 2017044109 | 3/2017 |
| WO | 2017052606 | 3/2017 |
| WO | 2017052631 | 3/2017 |
| WO | 2017052635 | 3/2017 |
| WO | 2017135767 | 8/2017 |
| WO | 2019005158 | 1/2019 |
| WO | 2019125364 | 6/2019 |
| WO | 2019125381 | 6/2019 |
| WO | 2019125383 | 6/2019 |

OTHER PUBLICATIONS

Fecioru-Morariu, M., et al., "Effects of Cu Dilution in IrMn on the Exchange Bias of CoFe/IrMn Bilayers", Physical Review Letters, vol. 99, No. 9, Aug. 1, 2007 (Aug. 1, 2007),XP055614810, US. ISSN: 0031-9007, DOI: 10.1103/PhysRevLett.99.097206.

Han, Guchang, et al., "Control of offset field and pinning stability in perpendicular magnetic tunneling junctions with synthetic antiferromagnetic coupling multilayer", Journal of Applied Physics 117, 17B515, 2015, 5 pgs.

Keller, J., et al., "Domain STTE Model for Exchange Bias II. Experiment", Physical Review, B. Condensed Matter, American Institute of Physics. New York, US, vol. 66, No. 1, Jul. 1, 2002 (Jul. 1, 2002), pp. 14431-01, XP001125751, ISSN: 0163-1829, DOI: 10.1103/PHYSREVB.66.014431.

Kiyohara, et al., "Giant Anomalous Hall Effect in the Chiral Antiferromagnet Mn3Ge", arXiv, Jul. 2, 2016, pp. 1-10, XP002793937, DOI: 10.1103/PhysRevApplied.5.064009.

Lau, et al., "Spin-orbit torques and spin hall magnetoresistance in antiferromagnetic hexagonal [epsilon] Mn3Ga/CoFeb bilayers", 2017 IEEE International Magnetics Conference (INTERMAG), IEEE, 24, Apr. 2017, p. 1, XP033141017, DOI: 10.1109/INTMAG.2017.8007779.

Lim, et al., "Study on Exchange-Biased Perpendicular Magnetic Tunnel Junction Based on Pd/Co Multilayers", IEEE Transactions on Magnetics, vol. 45, No. 6, Jun. 1, 2009 pp. 2407-2409, XP011258109, IEEE Service Center, New York, NY US ISSN: 0018-9464, DOI: 10.1109/TMAG.2009.2018590.

Liu, Luqiao, et al., "Spin Hall effect tunneling spectroscopy", Nature Physics, vol. 10, Aug. 2014, 6 pgs.

Liu, Luqiao, et al., "Spin-polarized tunneling study of spin-momentum locking in topological insulators", Physical Review B 91, 235437, 2015, 10 pgs.

Misra, A., "Control of exchange bias by diluting the antiferromagnetic layer", Journal of Applied Physics, American Institute of Physics, US, vol. 93, No. 10, May 15, 2003 (May 15, 2003), pp. 6593-6595, XP012057898, ISSN: 0021-8979, DOI: 10.1063/1.1543880.

Niida, et al., "Crystal distortion and weak ferromagnetism of Mn3+[delta] Ga 1-x Ge x alloys", Journal of Applied Physics, vol. 73, No. 10, May 15, 1993 pp. 5692-5694, XP055616327.

Wang, M., et al., "Tunnel Junction with Perpendicular Magnetic Anisotropy: Status and Challenges", Micromachines, vol. 6, No. 8, Aug. 10, 2015 (Aug. 10, 2015), pp. 1023-1045, XP055614473, CH, ISSN: 2072-666X, DOI: 10.3390/mi6081023.

Zelezny, J., et al., "Spin transport and spin torque in antiferromagnetic devices", Nature Physics, Nature Publishing Group, London, GB, vol. 14, No. 3, Mar. 2, 2018 (Mar. 2, 2018), pp. 220-228, XP036660204, ISSN: 1745-2473, DOI: 10.1038/S41567-018-0062-7.

Zhang, et al., "Spin Hall effect emerging from a chiral magnetic lattice without spin-orbit coupling", ARXIV, Apr. 12, 2017, pp. 1-13, XP081145399, ARXIV USA, p. 2, p. 9, line 3-line 14.

\* cited by examiner

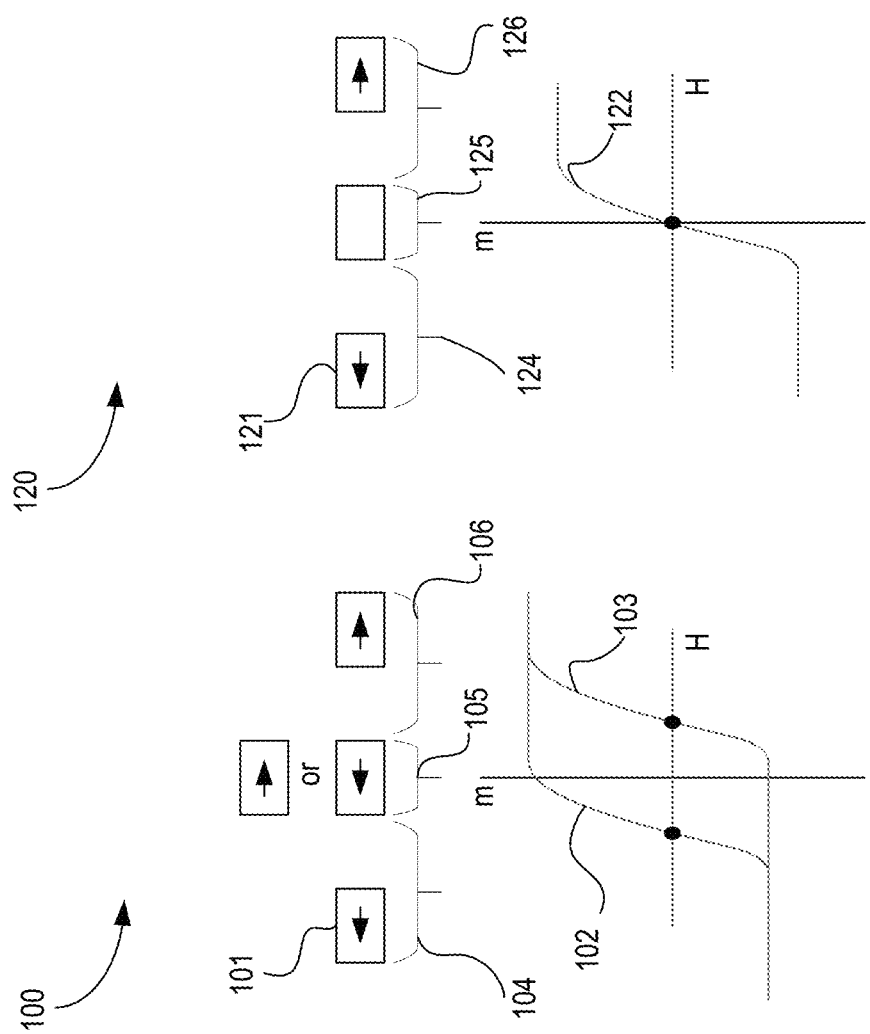

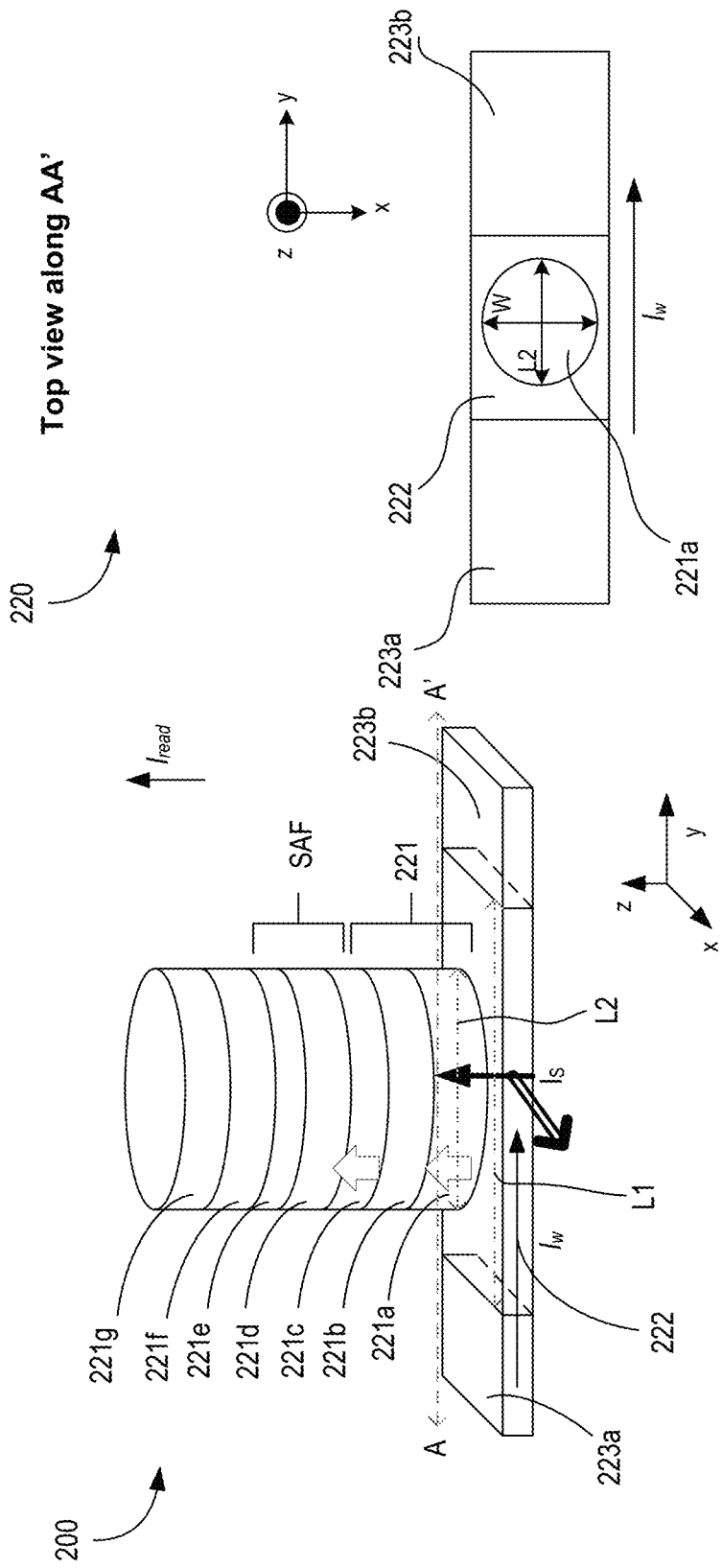

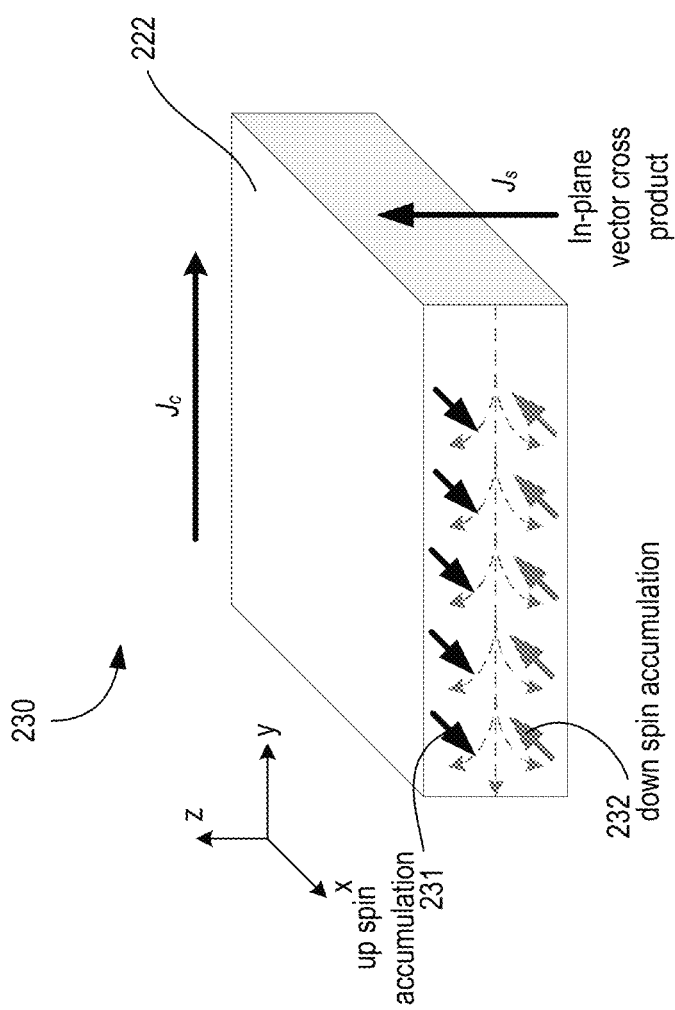

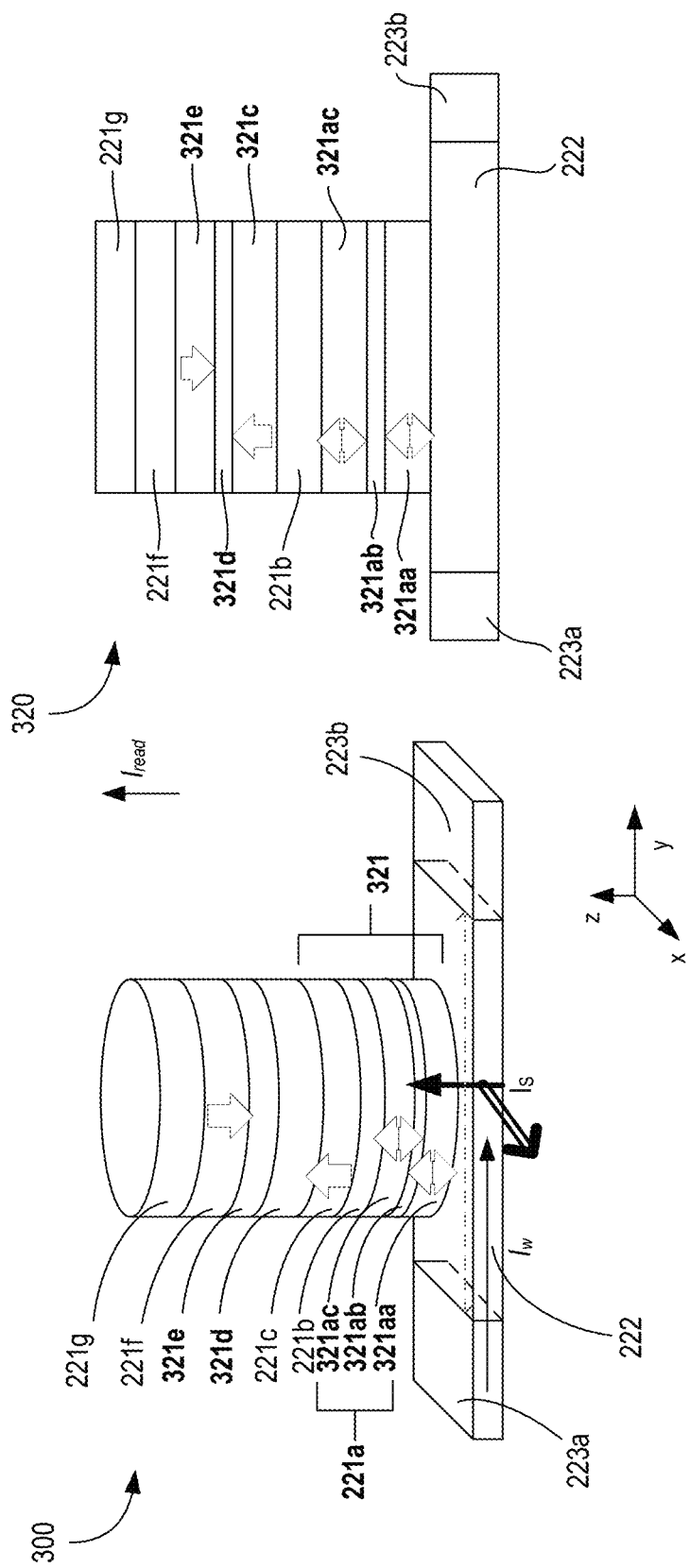

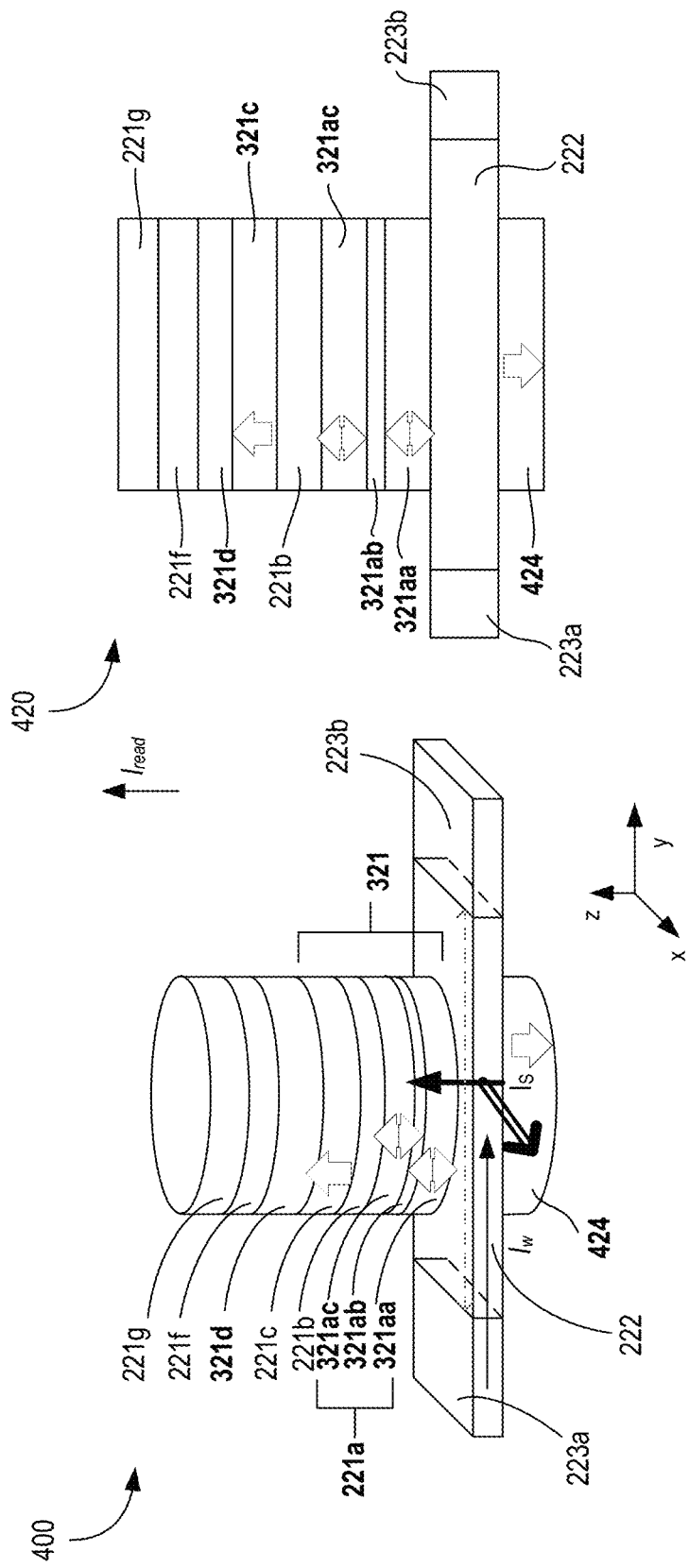

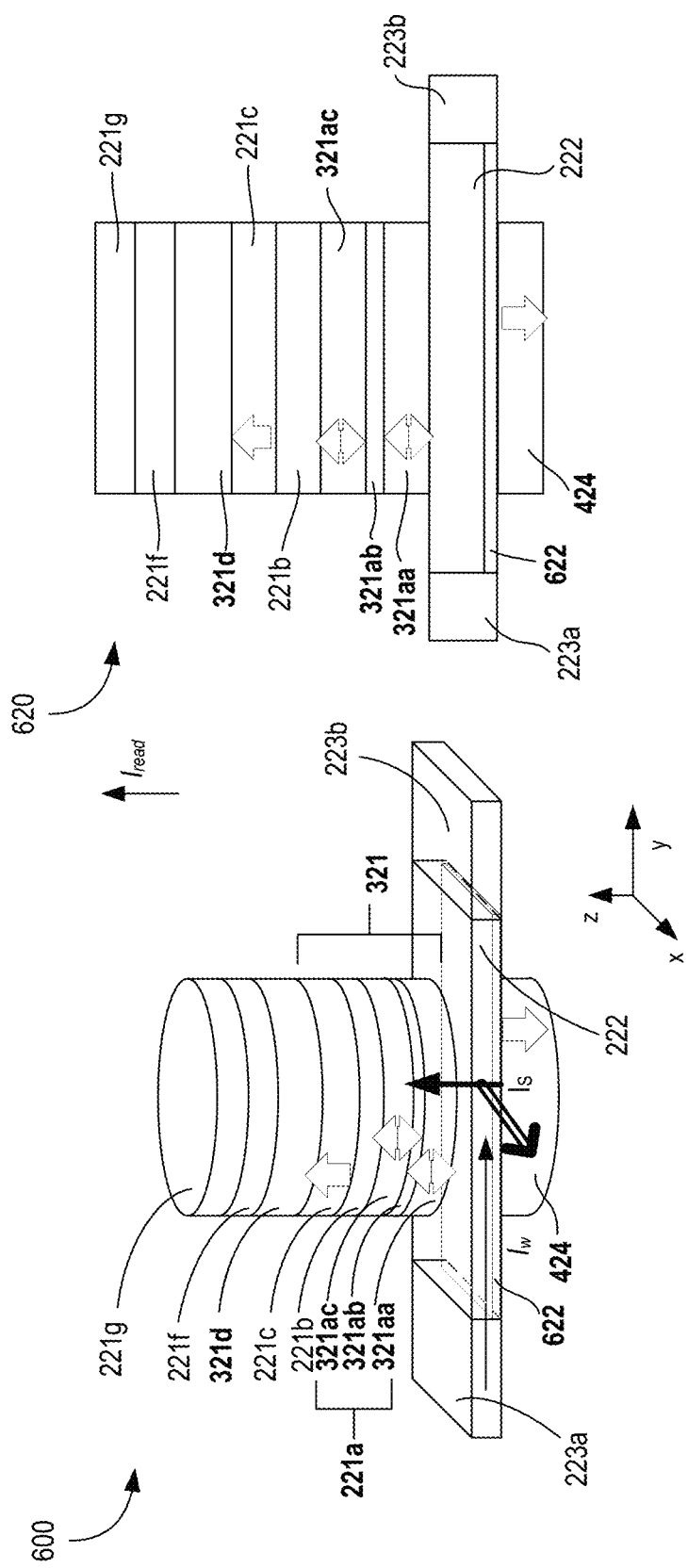

PERPENDICULAR EXCHANGE BIAS WITH ANTIFERROMAGNET FOR SPIN ORBIT COUPLING BASED MEMORY

BACKGROUND

Embedded memory with state retention can enable energy and computational efficiency. However, leading spintronic memory options, for example, spin transfer torque based magnetic random access memory (STT-MRAM), suffer from the problem of high voltage and high write current during the programming (e.g., writing) of a bit-cell. For instance, large write current (e.g., greater than 100 µA) and voltage (e.g., greater than 0.7 V) are required to write a tunnel junction based magnetic tunnel junction (MTJ). Limited write current also leads to high write error rates or slow switching times (e.g., exceeding 20 ns) in MTJ based MRAM. The presence of a large current flowing through a tunnel barrier leads to reliability issues in magnetic tunnel junctions.

Current fabrication of magnetic junctions use a synthetic anti-ferromagnet (SAF) on the top of the fixed or pinned magnet of the junction. SAF is used as a reference layer to minimize dipolar interactions induced between the SAF and a free magnet layer of the magnetic junction. However, fabricating the SAF is a challenge. For example, the SAF may require high quality atomic crystallinity for its formation, may require a precise thickness of one or more of its layers to exhibit its behavior, and may demand a low level of roughness for its fabrication. Further, getting a top SAF magnetic stack which is functional to very high temperatures needed for back end integration and Internet-of-Things (IOT) applications is challenging due to problems in barrier design and due to lack of templating materials for the deposition of SAF layers.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to an applied magnetic field for a ferromagnet.

FIG. 1B illustrates a magnetization response to an applied magnetic field for a paramagnet.

FIG. 2A illustrates a device having an out-of-plane magnetic tunnel junction (MTJ) stack coupled to a spin orbit coupling (SOC) interconnect, where the MTJ stack includes a synthetic anti-ferromagnet (SAF).

FIG. 2B illustrates a top view of the device of FIG. 2A.

FIG. 2C illustrates a cross-section of the SOC interconnect with electrons having their spins polarized in-plane and deflected up and down resulting from a flow of charge current.

FIGS. 3A-B illustrate a three dimensional (3D) view and corresponding cross-sectional view, respectively, of a device having an out-of-plane magnetic junction stack coupled to a SOC interconnect, where the magnetic junction stack includes an antiferromagnetic (AFM) structure to provide perpendicular exchange bias instead of a SAF, in accordance with some embodiments.

FIGS. 4A-B illustrate a 3D view and corresponding cross-sectional view, respectively, of a device having an out-of-plane magnetic junction stack coupled to a SOC interconnect, where the magnetic junction stack includes an AFM structure to provide perpendicular exchange bias instead of a SAF, and further includes a perpendicular magnet via to provide compensation for dipole field, in accordance with some embodiments.

FIGS. 6A-B illustrate a 3D view and corresponding cross-section view, respectively, of a device having a magnetic junction with magnets having perpendicular magnetization, where the magnetic junction stack includes an AFM structure to provide perpendicular exchange bias instead of a SAF, the device includes a perpendicular magnet via to provide compensation for dipole field, and where an AFM is embedded in the SOC interconnect, according to some embodiments of the disclosure.

DETAILED DESCRIPTION

Figure 5A:
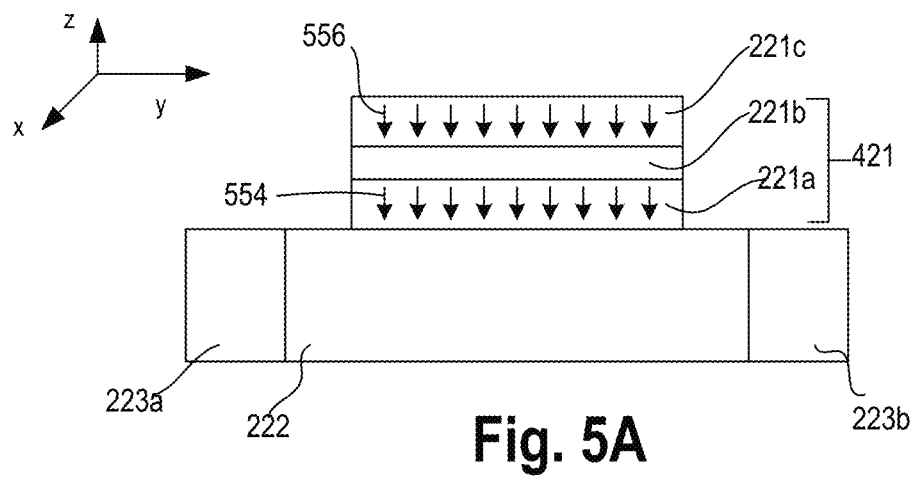
FIGS. 5A-C illustrate a mechanism for switching an out-of-plane magnetic junction memory device (e.g. device of FIG. 3A) formed on a spin orbit torque electrode, in accordance with some embodiments.

SAF reduces asymmetry of a free magnet structure of a magnetic junction. This asymmetry may be due to stray fields in the MTJs. Here, the asymmetry of the free magnet generally refers to the asymmetry in the hysteresis loop of the free magnet with reference to zero magnetic field point. In the absence of a SAF in a magnetic junction, dipolar interaction between the free magnet and the fixed magnet results in a highly asymmetrical reversal of the magnetization of the free magnet with respect to an applied field or to a current density. If the induced shift in the hysteresis loop is greater than a coercive field of the free magnet, then only one resistance state of the free magnet remains stable at zero field. Such a limitation is unsuitable for using magnetic junctions without something more. One way to reduce this asymmetry is to replace the fixed magnet with a SAF which consists of two ferromagnets that are anti-ferromagnetically coupled through a nonmagnetic spacer structure (e.g., Ru, Os, Hs, etc.). By selecting the correct thickness of the spacer structure, stray fields are reduced which in turn reduce the shift of the hysteresis loop of the free magnet.

However, fabricating the SAF comes with its own challenges. For example, SAF may require high quality atomic crystallinity for its formation, may require a precise thickness to exhibit its behavior, and may demand low level of roughness for its fabrication.

As discussed in the background section, getting a top SAF magnetic stack which is functional to very high temperatures needed for back end integration and IOT applications is challenging due to problems in barrier design and due to lack of templating materials for the deposition of SAF layers. Typically, the barrier layer and the SAF layers need to be carefully designed to balance the total moment. As of now, there is no known top SAF solution that works for spin orbit torque (SOT) MRAM above 400 Celsius (C) temperature. One solution has been to break the SAF down into two parts to balance the moment overall. The two step SAF method to break the SAF down into two parts, and the simple direct top SAF method has a challenge as the SAF performance can be determined by the shape of the etched device and hence is affected by device to device variation.

Some embodiments describe a SAF-less perpendicular magnet switch which can be applied in logic and memory. Some embodiments describe a perpendicular exchange bias antiferromagnetic (AFM) oxide which is used as the pinning layer for the fixed magnet layer of a magnetic junction. In some embodiments, a SAF is used either in a magnetic via or above the AFM layer to cancel the additional moment of the fixed layer or the dipole field between the fixed and free magnet layers.

In some embodiments, a magnetic junction (e.g., magnetic tunneling junction (MTJ) or spin valve) is provided which includes a first structure (e.g., a free magnet structure) comprising a magnet with an unfixed perpendicular magnetic anisotropy (PMA) relative to an x-y plane of a device. In some embodiments, the magnetic junction comprises a second structure comprising one of a dielectric or metal. In some embodiments, the magnetic junction comprises a third structure (e.g., fixed magnet structure) comprising a magnet with fixed PMA, wherein the third structure has an anisotropy axis perpendicular to the plane of the device, and wherein the third structure is adjacent to the second structure such that the second structure is between the first and third structures. In some embodiments, the magnetic junction comprises a fourth structure comprising an antiferromagnetic (AFM) material, the fourth structure adjacent to the third structure. In some embodiments, the magnetic junction comprises a fifth structure comprising a magnet with PMA, the fifth structure adjacent to the fourth structure. In some embodiments, the magnetic junction comprises an interconnect adjacent to the first structure, the interconnect comprising spin orbit material.

In some embodiments, the free magnet structure of the magnetic junction comprises at least two free magnets that are coupled by a coupling layer. In some embodiments, the coupling layer comprises one or more of: Ru, Os, Hs, Fe, or other similar transition metals from the platinum group of the periodic table. In some embodiments, the coupling layer(s) are removed so that the free magnets of the free magnet structure or stack are directly connected with one another forming a single magnet (or a composite magnet).

In some embodiments, one or more of the free magnets of the free magnet structure of the magnetic junction comprises a composite magnet. The composite magnet may be a super lattice including a first material and a second material, wherein the first material includes one of: Co, Ni, Fe, or Heusler alloy, and wherein the second material includes one of: Pt, Pd, Ir, Ru, or Ni. In some embodiments, the fixed magnet of the magnetic junction also comprises a composite magnet.

There are many technical effects of the various embodiments. For example, in some embodiments, the out-of-plane magnetization switching enables perpendicular magnet anisotropy (PMA) based magnetic devices (e.g., MRAM and logic) comprising spin orbit effects that generate perpendicular spin currents. The perpendicular magnet switch of some embodiments enables low programming voltages (or higher current for identical voltages) enabled by giant spin orbit effects (GSOE) for perpendicular magnetic memory and logic. The perpendicular magnet switch, of some embodiments, results in lower write error rates which enable faster MRAM (e.g., write time of less than 10 ns). The perpendicular magnet switch of some embodiments decouple write and read paths to enable faster read latencies. The perpendicular magnet switch of some embodiments uses significantly smaller read current through the magnetic junction (e.g., MTJ or spin valve) and provides improved reliability of the tunneling oxide and MTJs. For example, less than 10 µA compared to 100 µA for nominal write is used by the perpendicular magnet switch of some embodiments. Further, by eliminating the use of a SAF in the magnetic junction based memory device, fabricating SOT-MRAM above 400 C is possible which is currently gated by the top SAF (e.g., the SAF on top of the magnetic junction). As such, the challenge of fabricating the SAF is mitigated.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque,).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/− 20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetization. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIGS. 2A-B illustrate a three-dimensional (3D) view 200 and corresponding top view 220, respectively, of device having an out-of-plane magnetic junction stack coupled to a spin orbit coupling (SOC) interconnect, where the magnetic junction stack includes a free magnet layer much smaller than a length of the SOC interconnect.

Here, the stack of layers having magnetic junction 221 is coupled to an electrode 222 comprising spin Hall effect (SHE), spin orbit torque (SOT), SOC material, where the SHE material converts charge current $I_W$ (or write current) to spin polarized current $I_S$. The device of FIG. 2A forms a three-terminal memory cell with SHE induced write mechanism and MTJ based read-out. The device of FIG. 2A comprises magnetic junction 221, SHE Interconnect or electrode 222, and non-magnetic metal(s) 223a/b. In one example, MTJ 221 comprises layers 221a, 221b, and 221c. In some embodiments, layers 221a and 221c are ferromagnetic layers. In some embodiments, layer 221b is a metal or a tunneling dielectric.

For example, when the magnetic junction is a spin valve, layer 221b is metal or a metal oxide (e.g., a non-magnetic metal such as Al and/or its oxide) and when the magnetic junction is a tunneling junction, then layer 221 b is a dielectric (e.g. MgO, $Al_2O_3$). One or both ends along the horizontal direction of SOC Interconnect 222 is formed of non-magnetic metals 223a/b. Additional layers 221d, 221e, 221f, and 221g can also be stacked on top of layer 221 c. In some embodiments, layer 221 g is a non-magnetic metal electrode.

So as not to obscure the various embodiments, the magnetic junction 221 is described as a magnetic tunneling junction (MTJ). However, the embodiments are also applicable for spin valves. A wide combination of materials can be used for material stacking of magnetic junction 221. For example, the stack of layers 221a, 221b, 221c, 221d, 221e, 221f, and 221g are formed of materials which include: $Co_xFe_yB_z$, MgO, $Co_xFe_yB_z$, Ru, $Co_xFe_yB_z$, IrMn, and Ru, respectively, where 'x,' 'y,' and 'z' are fractions of elements in the alloys. Other materials may also be used to form MTJ 221. MTJ 221 stack comprises free magnetic layer 221 a, MgO tunneling oxide 221b, a fixed magnetic layer 221 c/d/e which is a combination of CoFe, Ru, and CoFe layers, respectively, referred to as Synthetic Anti-Ferromagnet (SAF), and an Anti-Ferromagnet (AFM) layer 221 f. The SAF layer has the property that the magnetization in the two CoFe layers are opposite, and allows for cancelling the dipole fields around the free magnetic layer such that a stray dipole field will not control the free magnetic layer.

In some embodiments, the free and fixed magnetic layers (221a and 221c, respectively) are formed of CFGG (i.e., Cobalt (Co), Iron (Fe), Germanium (Ge), or Gallium (Ga) or a combination of them). In some embodiments, FM 221a/c are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, fixed magnet layer 221 c is a magnet with perpendicular magnetic anisotropy (PMA). For example, fixed magnet structure 221c has a magnetization pointing along the z-direction and is perpendicular to the x-y plane of the device 200. In some embodiments, the magnet with PMA comprises a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; and materials with tetragonal crystal structure. In some embodiments, the magnet with PMA is formed of a single layer of one or more materials. In some embodiments, the single layer is formed of MnGa.

$L1_0$ is a crystallographic derivative structure of an FCC (face centered cubic lattice) structure and has two of the faces occupied by one type of atom and the corner and the other face occupied with the second type of atom. When phases with the $L1_0$ structure are ferromagnetic the magnetization vector usually is along the [0 0 1] axis of the crystal. Examples of materials with $L1_0$ symmetry include CoPt and FePt. Examples of materials with tetragonal crystal structure and magnetic moment are Heusler alloys such as CoFeAl, MnGe, MnGeGa, and MnGa.

SOC or SOT Interconnect 222 (or the write electrode) includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SOC/SOT interconnect 222 comprises a spin orbit 2D material which includes one or more of: graphene, $BiSe_2$, $BiS_2$, $BiSe_xTe_{2-x}$, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, the SOC/SOT interconnect 222 comprises spin orbit material which includes one of a 2D material or a 3D material, wherein the 3D material is thinner than the 2D material such as $WS_2$, $WSe_2$, $WTe_2$, $MoS_2$, $MoSe_2$, $MoTe_2$, $PtSe_2$, $PS_2$, $B_2S_3$, $Sb_2S_3$, and $Ta_2S$. In some embodiments, the SHE interconnect 222 comprises a spin orbit material which includes materials that exhibit Rashba-Bychkov effect. In some embodiments, material which includes materials that exhibit Rashba-Bychkov effect comprises materials $ROCh_2$, where 'R' includes one or more of: La, Ce, Pr, Nd, Sr, Sc, Ga, Al, or In, and where "Ch" is a chalcogenide which includes one or more of: S, Se, or Te.

In some embodiments, SOC/SOT Interconnect 222 transitions into high conductivity non-magnetic metal(s) 223a/b to reduce the resistance of SOC/SOT Interconnect 222. The non-magnetic metal(s) 223a/b include one or more of: Cu, Co, α-Ta, Al, CuSi, NiSi, or graphene.

The thickness of a ferromagnetic layer (e.g., fixed or free magnetic layer) may determine its equilibrium magnetization direction. For example, when the thickness of the ferromagnetic layer 221 a/c is above a certain threshold (depending on the material of the magnet, e.g. approximately 1.5 nm for CoFe), then the ferromagnetic layer exhibits magnetization direction which is in-plane. Likewise, when the thickness of the ferromagnetic layer 221 a/c is below a certain threshold (depending on the material of the magnet), then the ferromagnetic layer 221 a/c exhibits magnetization direction which is perpendicular to the plane of the magnetic layer.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or $L1_0$-type of crystals, where $L1_0$ is a type of crystal class which exhibits perpendicular magnetization), can also determine the direction of magnetization.

In this example, the applied current $I_w$ is converted into spin current $I_s$ by SOT/SOC Interconnect 222. This spin current switches the direction of magnetization of the free layer and thus changes the resistance of MTJ 221. However, to read out the state of MTJ 221, a sensing mechanism is needed to sense the resistance change.

The magnetic cell is written by applying a charge current via SOC/SOT Interconnect 222. The direction of the magnetic writing in free magnet layer 221 a is decided by the direction of the applied charge current. Positive currents (e.g., currents flowing in the +y direction) produce a spin injection current with transport direction (along the +z direction) and spins pointing to the +x direction. The injected spin current in turn produces spin torque to align the free magnet 221a (coupled to the SOC/SOT layer 222) in the +x direction. Negative currents (e.g., currents flowing in the −y direction) produce a spin injection current with transport direction (along the +z direction) and spins pointing to the −x direction. The injected spin current in turn produces spin torque to align the free magnet 221a in the −x direction. In some embodiments, in materials with the opposite sign of the SHE/SOC effect, the directions of spin polarization and thus of the free layer magnetization alignment are reversed compared to the above.

FIG. 2C illustrates a cross-section 230 of the SOC interconnect 222 with electrons having their spins polarized in-plane and deflected up and down resulting from a flow of charge current. In this example, positive charge current represented by $J_c$ produces spin-front (e.g., in the +x direction) polarized current 231 and spin-back (e.g., in the −x direction) polarized current 232. The injected spin current $\vec{I}_s$ generated by a charge current $\vec{I}_c$ in the write electrode 222 is given by:

$$\vec{I}_s = P_{SOC}(w,t,\lambda_{sf},\theta_{SOC})(\vec{I}_c \times \hat{z}) \qquad (1)$$

where, the vector of spin current $\vec{I}_s = \vec{I}_\uparrow - \vec{I}_\downarrow$ points in the direction of transferred magnetic moment and has the magnitude of the difference of currents with spin along and opposite to the spin polarization direction, $\hat{z}$ is the unit vector perpendicular to the interface, $P_{SOC}$ is the spin Hall injection efficiency which is the ratio of magnitude of transverse spin current to lateral charge current, w is the width of the magnet, t is the thickness of the SOC/SOT Interconnect (or write electrode) 222, $\lambda_{sf}$ is the spin flip length in SOC/SOT Interconnect 222, $\theta_{SOC}$ is the spin Hall angle for SOC Interconnect 222 to free ferromagnetic layer interface. The injected spin angular momentum responsible for the spin torque given by:

$$\vec{S} = h\vec{I}_s/2e \qquad (2)$$

The generated spin up and down currents 231/232 (e.g., $\vec{J}_s$) are described as a vector cross-product given by:

$$\vec{J}_s = \theta_{SOC}(\vec{J}_c \times \hat{z}) \qquad (3)$$

This spin to charge conversion is based on Tunnel Magneto Resistance (TMR) which is highly limited in the signal strength generated. The TMR based spin to charge conversion has low efficiency (e.g., less than one).

FIGS. 3A-B illustrate a 3D view 300 and corresponding cross-sectional view 320, respectively, of a device having an out-of-plane magnetic junction stack coupled to a SOC interconnect, where the magnetic junction stack includes an antiferromagnetic (AFM) structure to provide perpendicular exchange bias instead of a SAF, in accordance with some embodiments.

A typical SAF (e.g., layers 221c, 221d, and 221e) comprises fixed magnets with an exchange structure (or spacer layer) between them. The exchange structure can include one or more of: Ru, Ir, Al, Cu, or Ag. For SAF to cancel the dipole fields around the free magnet 221a, the thickness of the exchange structure is carefully designed so there is spin tunneling through it. Any un-cancelled dipole field can interfere with the magnetization of free magnet 221a resulting in higher write current and write error rates. Fabricating the SAF may also use high atomic crystallinity between the fixed magnets and the exchange structure between them. In various embodiments, SAF 221d/e is removed, and the technical effect of SAF 221d/e is provided by fabricating an AFM structure 321d under electrode 221g. In some embodiments, to balance the dipole field, an additional compensation layer 321e having PMA is coupled to the AFM structure 321d. This compensation layer 321e also becomes a fixed magnet due to the AFM structure 321d.

In some embodiments, AFM structure 321d comprises of doped or normal oxide perovskite or other multiferroic oxide that has shown to have perpendicular exchange bias at the interface with a magnet. This strong exchange bias is used to pin the fixed (reference) layer 221c of the magnetic junction 321. Typically, the Curie and the Neel temperature of the AFM structure 321d (e.g., AFM oxide layer) are very high (e.g., in the 600 C plus range), and hence the exchange bias is thermally very stable. The AFM exchange bias electrode 321d pins the reference layer 221c and acts as a SAF. In this embodiment, an additional PMA magnet 321e is fabricated on the top of the exchange bias layer 321d to compensate the additional moment of the fixed layer 221c for balancing the magnetic loop around 0 Oe.

In some embodiments, the AFM structure 321d (e.g., AFM exchange bias layer) comprises one or more of: $Cr_2O_3$, BFO (bismuth ferrite), LBFO (Lanthanum doped bismuth ferrite), FeMn, $LaMnO_3$ and $La_2CuO_4$, $TmFeO$, $ZnCr_2O_4$, $CuCl_2$, $FeCl_2$, $MnF_2$, $FeF_2$, or $KNiF_3$ and their dopants. In some embodiments, AFM structure 321d comprises a material which includes one of: Ir, Pt, Mn, Pd, or Fe. In some embodiments, AFM structure 321d is a quasi-two-dimensional triangular AFM including $Ni_{(1-x)}M_xGa_2S_4$, where 'M' includes one of: Mn, Fe, Co or Zn. In some embodiments, AFM structure 321d comprises a pair of fixed magnets with out-of-plane magnetization, and a coupling layer between the fixed magnets. In some embodiments, the materials for the fixed magnets of the AFM structure 321d can be according to any of the materials for magnets discussed herein. In some embodiments, the material for coupling layer of the AFM structure 321d can be one or more of: Ru, Os, Hs, Fe, or other similar transition metals from the platinum group of the periodic table. In some embodiments, the thickness of AFM structure 321d along the z-axis is in a range of 2 nm to 20 nm.

In some embodiments, the compensation layer 321e (e.g., the additional PMA magnet) comprises one or more of: Co, Fe, Ni, Mn, Gd, Tb, Nd in any combination with Pt, B, and other doping materials like Cu, Ga, Rh, etc. In some embodiments, the compensation layer 321e has a thickness along the z-axis in a range of 1 nm to 20 nm.

In some embodiments, free magnet 221a is implemented as stack of layers or films 321aa, 321ab, and 321ac. Here, the magnetic junction is illustrated by reference sign 321, where the layers under layer 221b (e.g., dielectric or metal/metal-oxide) together form the structure comprising the free magnet 221a of the junction. In some embodiments, the structure replacing free magnet 221a comprises at least two free magnets 321aa and 321ac with a coupling layer 321ab between them, where one of the free magnet couples to (or is adjacent to) the SOC electrode 222 while the other free magnet of the structure couples to or is adjacent to a dielectric (e.g., when the magnetic junction is an MTJ) or a metal or its oxide (e.g., when the magnetic junction is a spin valve). In some embodiments, the structure comprises a first free magnet 321aa having perpendicular magnetization that can point substantially along the +z-axis or −z-axis according to an external field (e.g., spin torque, spin coupling, electric field); a coupling layer 321ab; and a second free magnet 321ac having perpendicular magnetization that can point substantially along the +z-axis or −z-axis. In various embodiments, the second free magnet 321ac is adjacent to layer 221b (e.g., dielectric or metal/metal-oxide).

In some embodiments, the coupling layer 321ab includes one or more of: Ru, Os, Hs, Fe, or other transition metals from the platinum group of the periodic table. In some embodiments, magnets 321aa and 321ac comprise CFGG. In some embodiments, magnets 521aa and 521ac are formed from Heusler alloys. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, magnets 321aa and 321ac with PMA comprises a stack of materials, wherein the materials for the stack are selected from a group comprising: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; or materials with tetragonal crystal structure. In some embodiments, the magnet with PMA is formed of a single layer of one or more materials. In some embodiments, the single layer comprises Mn and Ga (e.g., MnGa).

FIGS. 4A-B illustrate a 3D view 400 and corresponding cross-sectional view 420, respectively, of a device having an out-of-plane magnetic junction stack coupled to a SOC interconnect, where the magnetic junction stack includes an AFM structure to provide perpendicular exchange bias instead of a SAF, and further includes a perpendicular magnet via to provide compensation for dipole field, in accordance with some embodiments.

The memory device of FIGS. 4A-B is similar to the memory device of FIGS. 3A-B, except that the compensation layer 321e is removed and placed under the SOC/SOT interconnect 222. In some embodiments, the additional PMA magnet 424 under SOT/SOC layer 222 is fabricated as a magnetic via, and is to compensate the additional moment of the fixed layer 221 c for balancing the magnetic loop around 0 Oe. In some embodiments, fixed magnet 221c is a composite magnet. In some embodiments, free magnet 221a is a composite magnet.

Figure 5B:
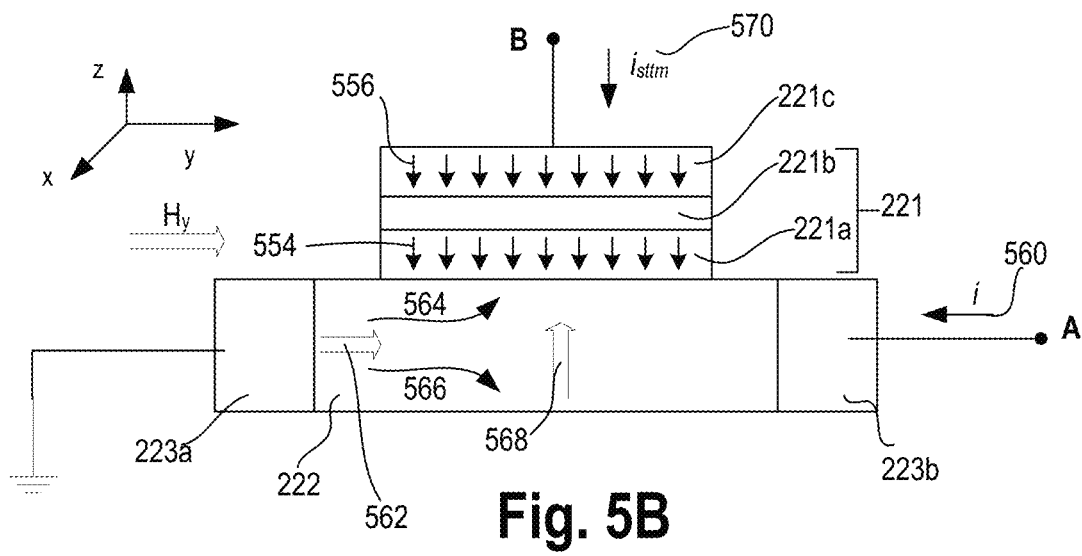
Figure 5C:
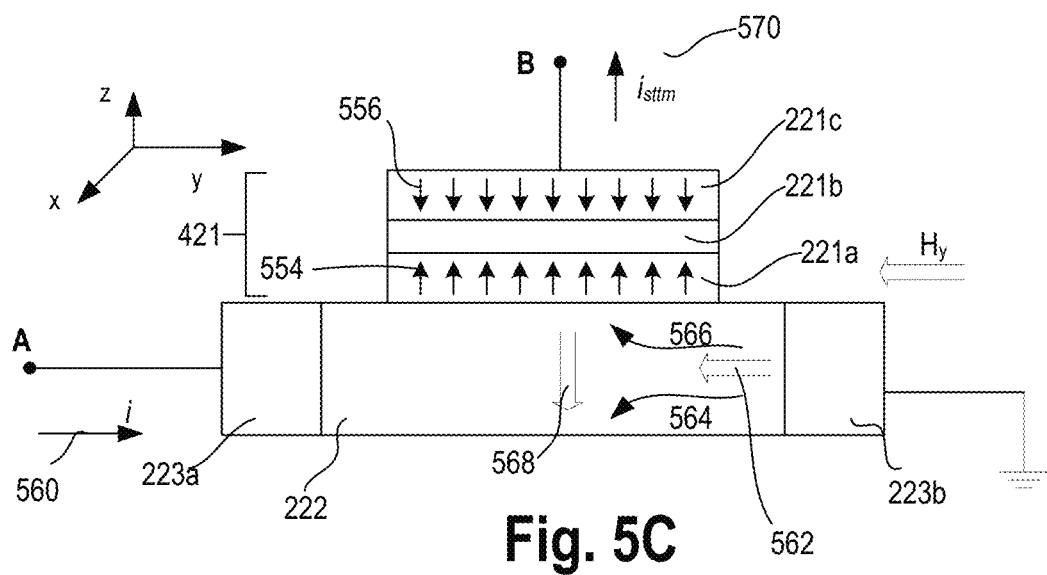

FIGS. 5A-C illustrate a mechanism for switching an out-of-plane magnetic junction memory device (e.g. device of FIG. 3A) formed on a spin orbit torque electrode, in accordance with some embodiments.

FIG. 5A illustrates an MTJ memory device (e.g., device of FIG. 3A) where magnetic junction 221 or 321 is disposed on a spin orbit torque electrode 222, and where a magnetization 554 of the free magnet 221a (also referred to as storage layer 221 a) is in the same direction as a magnetization 556 of the fixed magnet 221c. In some embodiments, the direction of magnetization 554 of the storage layer 221 a and the direction of magnetization 556 of the fixed magnet 221c are both in the negative z-direction as illustrated in FIG. 5A. When the magnetization 554 of the storage layer 221 a is in the same direction as a magnetization 556 of the fixed magnet 221c, MTJ memory device of FIG. 3A is in a low resistance state. Conversely, when the magnetization 554 of the storage layer 221 a is in the opposite direction as a magnetization 556 of the fixed magnet 221c, MTJ memory device of FIG. 3A is in a high resistance state.

FIG. 5B illustrates a SOT memory device (e.g., device of FIG. 3A) switched to a high resistance state. In an embodiment, a reversal in the direction of magnetization 554 of the storage layer 221 a in FIG. 5B compared to the direction of magnetization 554 of the storage layer 221 a is brought about by (a) inducing a spin hall current 568 in the spin orbit torque electrode 222 in the y-direction and (b) by applying a spin torque transfer current 570, $i_{STTM}$, (by applying a positive voltage at terminal B with respect to ground C), and/or (c) by applying an external magnetic field, $H_y$, in the y-direction.

In an embodiment, a charge current 560 is passed through the spin orbit torque electrode 222 in the negative y-direction (by applying a positive voltage at terminal A with respect to ground C). In response to the charge current 560, an electron current 562 flows in the positive y-direction. The electron current 560 includes electrons with two opposite spin orientations and experience a spin dependent scattering phenomenon in the spin orbit torque electrode 222.

The electron current 562 includes electrons with two opposing spin orientations, a type I electron 566, having a spin oriented in the negative x-direction and a type II electron 564 having a spin oriented in the positive x-direction. In some embodiments, electrons constituting the electron current 562 experience a spin dependent scattering phenomenon in the spin orbit torque electrode 222. The spin dependent scattering phenomenon is brought about by a spin-orbit interaction between the nucleus of the atoms in the spin orbit torque electrode 222 and the electrons in the electron current 562. The spin dependent scattering phenomenon causes type I electrons 566, whose spins are oriented in the negative x-direction, to be deflected upwards towards an uppermost portion of the spin orbit torque electrode 222 and type II electrons 564 whose spins are oriented in the positive x-direction to be deflected downwards towards a lowermost portion of the spin orbit torque electrode 222.

The separation between the type I electron spin angular moment 566 and the type II electron spin angular moment 564 induces a polarized spin diffusion current 568 in the spin orbit torque electrode 222. In some embodiments, the polarized spin diffusion current 568 is directed upwards toward the free magnet 221a of the magnetic junction memory device of FIG. 3A as depicted in FIG. 5B. The polarized spin diffusion current 568 induces a spin hall torque on the magnetization 554 of the free magnet 221a. The spin hall torque rotates the magnetization 554 to a temporary state pointing in the negative x-direction. In some embodiments, to complete the magnetization reversal process an additional torque is applied. The $i_{STTM}$ current 570 flowing through the MTJ memory device of FIG. 3A exerts an additional torque on the magnetization 554 of the storage layer 221 a. The combination of spin hall torque and spin transfer torque causes flipping of magnetization 554 in the storage layer 221 a from the intermediate magnetization state (negative x-direction) to a positive z-direction illustrated in FIG. 5B. In some embodiments, an additional torque can be exerted on the storage layer 221 a by applying an external magnetic field, $H_y$, in the y-direction, as illustrated in FIG. 5B, instead of applying an $i_{STTM}$ current 570.

FIG. 5C illustrates a SOT memory device switched to a low resistance state. In an embodiment, a reversal in the direction of magnetization 554 of the storage layer 221 a in FIG. 5C compared to the direction of magnetization 554 of the storage layer 221 a in FIG. 5B is brought about by (a) reversing the direction of the spin hall current 568 in the spin orbit torque electrode 222 and (b) by reversing the direction of the $i_{STTM}$ current 570, and/or (c) by reversing the direction of the external magnetic field, $H_y$.

FIGS. 6A-B illustrate a 3D view 600 and corresponding cross-section view 620, respectively, of a device having a magnetic junction with magnets having perpendicular magnetization, where the magnetic junction stack includes an AFM structure to provide perpendicular exchange bias instead of a SAF, the device includes a perpendicular magnet via to provide compensation for dipole field, and where an AFM is embedded in the SOC interconnect, according to some embodiments of the disclosure.

The memory device of FIGS. 6A-B is similar to the memory device of FIGS. 4A-B, except that an AFM 622 is embedded in the SOC interconnect 222. In some embodiments, AFM 622 can behave as an etch stop layer when fabricating SOC interconnect 222. As such, one or more additional processes for forming an etch stop layer is/are removed. In various embodiments, AFM 622 assists with keeping the magnetization of magnet 525 stable with in-plane magnetization. In some embodiments, AFM 622 also comprises a pair of fixed magnets (not shown) with out-of-plane magnetization, and a coupling layer between the fixed magnets like AFM 321*d*.

Figure 7:
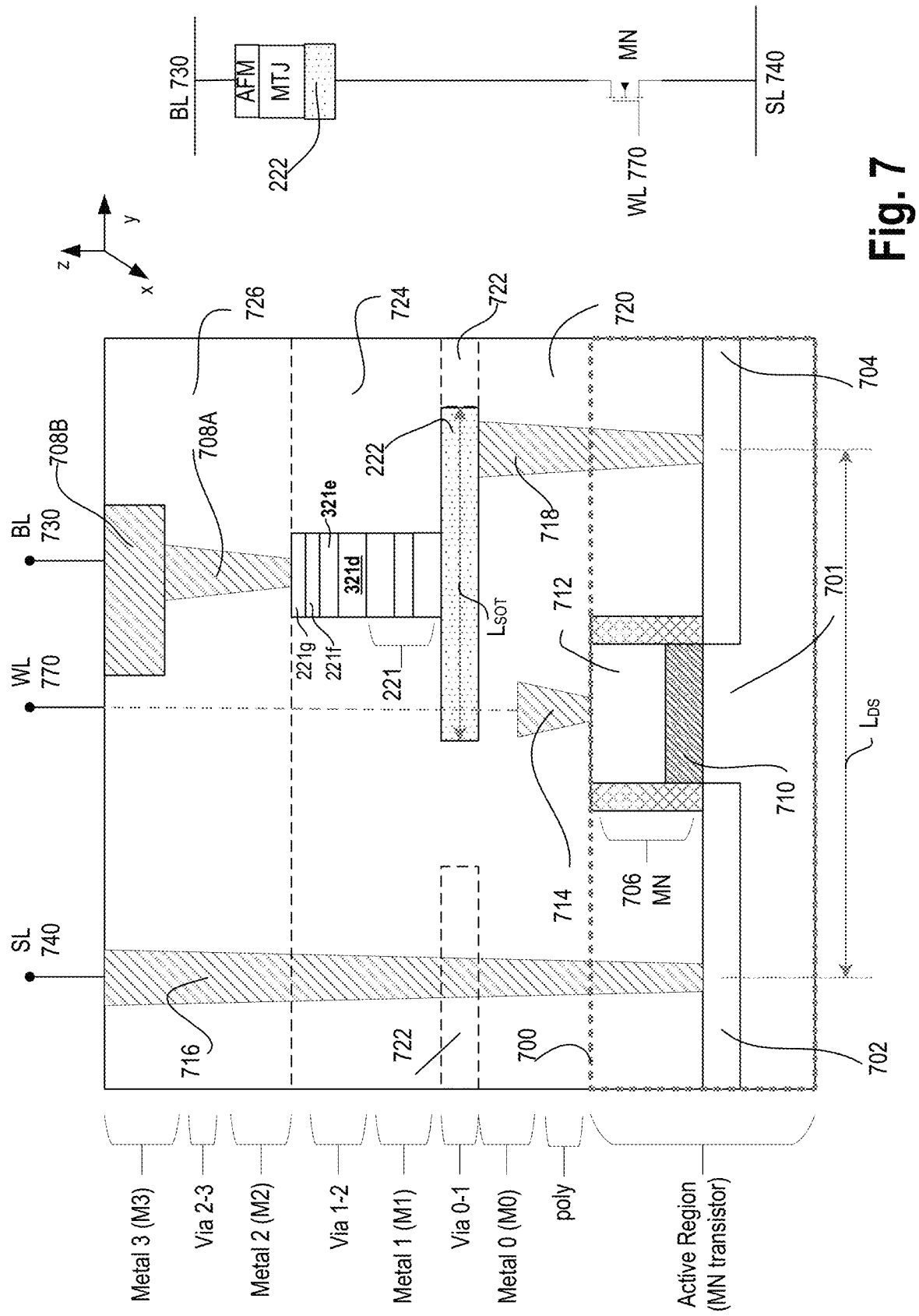
FIG. 7 illustrates a cross-sectional view of a SOT memory device (e.g., any one of devices of FIGS. 3-6) coupled to a first transistor and a bit line, according to some embodiments.

FIG. 7 illustrates a cross-sectional view of a SOT memory device (e.g., any one of devices of FIGS. 3-6) coupled to a first transistor and a bit line, according to some embodiments.

In an embodiment, the transistor 700 has a source region 702, a drain region 704 and a gate 706. The transistor 700 (e.g., n-type transistor MN) further includes a gate contact 714 disposed above and electrically coupled to the gate 706, a source contact 716 disposed above and electrically coupled to the source region 702, and a drain contact 718 disposed above and electrically coupled to the drain region 704 as is illustrated in FIG. 7. In some embodiments, an SOT memory device such as a SOT memory device of FIGS. 3A, 4A, 6A is disposed above the transistor 700.

In some embodiments, the SOT memory device of FIGS. 3A, 4A, 6A includes a spin orbit torque electrode, such as spin orbit torque electrode 222, a magnetic tunnel junction memory device such as MTJ 221/321 disposed on the spin orbit torque electrode 222, and a conductive interconnect structure such as conductive interconnect structure 708 (e.g., structure 708*a/b*) disposed on and coupled to the MTJ 221/321. In some embodiments, the spin orbit torque electrode 222 is disposed on the drain contact 718 of the transistor 700.

In some embodiments, the MTJ memory device of FIGS. 3A, 4A, 6A (e.g., which includes 221/321) includes individual functional layers that are described in association with FIGS. 2-4. In some embodiments, the spin orbit torque electrode 222 has a length, $L_{SOT}$ that is less than a distance of separation, $L_{DS}$ between the drain contact 718 and the source contact 716. In some embodiments, a portion of the spin orbit torque electrode 222 extends above the gate electrode 712 and the gate contact 714. In some embodiments, a portion of the spin orbit torque electrode 222 extends over the gate electrode 712. In some embodiments, the spin orbit torque electrode 222 is in a first y-z plane as illustrated in FIG. 5A.

In some embodiments, the gate contact 714 is directly below the spin orbit torque electrode 222. In some embodiments, a word-line (WL) contact is disposed onto the gate contact 714 on a second y-z plane behind (into the page) the first y-z plane of the spin orbit torque electrode 222. In some embodiments, the spin orbit torque electrode 222 that may not contact the word-line contact is disposed on the gate electrode 712.

In some embodiments, transistor 700 associated with substrate 701 is a metal-oxide-semiconductor field-effect transistor (MOSFET or simply MOS transistors), fabricated on the substrate 701. In various embodiments of the present disclosure, the transistor 700 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor 700 is a tri-gate transistor.

In some embodiments, a voltage $V_{DS}$ is applied between the bit-line (BL) 730 and the source-line (SL) 740 and a word-line 750 is energized above a threshold voltage, $V_{TH}$ on the transistor 700. In some embodiments, an electron current (spin hall current) flows through the spin orbit torque electrode 222 and causes a spin diffusion current to flow toward the MTJ memory device of FIGS. 3A, 4A, 6A. The spin diffusion current exerts a torque on the magnetization of the free magnet 421*a* of MTJ 221/321.

In some embodiments, by applying a voltage $V_{DS}$ between bit-line 730 and source-line 540, current can flow through the MTJ memory device of FIGS. 3A, 4A, 6A. In some embodiments, a voltage $V_{DS}$ that is equal to or greater than the threshold voltage $V_{TS}$ is enough to generate spin polarized current through the MTJ 221/321. In some embodiments, the spin transfer torque current flowing through the MTJ 221/321 also imparts torque to the free magnet 221*a* adding to the torque from the spin diffusion current. In some embodiments, the combined effect of the spin transfer torque and the spin diffusion torque can switch the magnetization of the free magnet 221*a*. In some embodiments, by reversing the polarity of the voltage $V_{DS}$, and applying a voltage that meets or exceeds a threshold voltage, the direction of magnetization of the free magnet 221*a* is switched back to a previous configuration.

In some embodiments, by applying a voltage between a bit-line 730 and source-line 730, and by applying a voltage above a threshold voltage, $V_{TH}$ on the word-line 750 of the transistor 700, the MTJ memory device of FIGS. 3A, 4A, 6A can undergo magnetization switching without the need for an additional voltage source (e.g. a second transistor). In some embodiments, implementing an SOT memory device of FIGS. 3A, 4A, 6A above a transistor can increase the number of SOT memory devices of FIGS. 3A, 4A, 6A in a given area of a die by at least a factor of two.

In some embodiments, the underlying substrate 701 represents a surface used to manufacture integrated circuits. In some embodiments, the substrate 701 includes a suitable semiconductor material such as but not limited to, single crystal silicon, polycrystalline silicon and silicon on insulator (SOI). In another embodiment, the substrate 701 includes other semiconductor materials such as germanium, silicon germanium, or a suitable group III-V or group III-N compound. The substrate 701 may also include semiconductor materials, metals, dopants, and other materials commonly found in semiconductor substrates.

In some embodiments, the transistor 700 includes a gate stack formed of at least two layers, a gate dielectric layer 710 and a gate electrode layer 712. The gate dielectric layer 710 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 710 to improve its quality when a high-k material is used.

The gate electrode layer 712 of the transistor 700 is formed on the gate dielectric layer 710 and may comprise of at least one P-type work-function metal or N-type work-function metal, depending on whether the transistor is to be a PMOS or an NMOS transistor. In some embodiments, the gate electrode layer 712 may comprise of a stack of two or more metal layers, where one or more metal layers are work-function metal layers and at least one metal layer is a conductive fill layer.

For a PMOS transistor, metals that may be used for the gate electrode layer 712 include, but are not limited to, ruthenium, palladium, platinum, cobalt, nickel, and conductive metal oxides, e.g., ruthenium oxide. A P-type metal layer will enable the formation of a PMOS gate electrode layer 712 with a work-function that is between about 4.9 eV and about 5.2 eV. For an NMOS transistor, metals that may be used for the gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 712 with a work-function that is between about 3.9 eV and about 4.2 eV.

In some embodiments, the gate electrode layer 712 may comprise a "U"-shaped structure that includes a bottom portion substantially parallel to the surface of the substrate and two sidewall portions that are substantially perpendicular to the top surface of the substrate. In another embodiment, at least one of the metal layers that form the gate electrode layer 712 may simply be a planar layer that is substantially parallel to the top surface of the substrate and does not include sidewall portions substantially perpendicular to the top surface of the substrate. In some embodiments of the present disclosure, the gate electrode layer 712 may comprise of a combination of U-shaped structures and planar, non-U-shaped structures. For example, the gate electrode layer 712 may comprise of one or more U-shaped metal layers formed atop one or more planar, non-U-shaped layers.

In some embodiments, a pair of gate dielectric layer 710 may be formed on opposing sides of the gate stack that bracket the gate stack. The gate dielectric layer 710 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 702 and drain region 704 are formed within the substrate adjacent to the gate stack of the transistor 700. The source region 702 and drain region 704 are generally formed using either an implantation/diffusion process or an etching/deposition process. In the former process, dopants such as boron, aluminum, antimony, phosphorous, or arsenic may be ion-implanted into the substrate to form the source region 702 and drain region 704. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 702 and drain region 704. In some embodiments, the source region 702 and drain region 704 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 702 and drain region 704 may be formed using one or more alternate semiconductor materials such as germanium or a suitable group III-V compound. In some embodiments, one or more layers of metal and/or metal alloys may be used to form the source region 702 and drain region 704.

In some embodiments, the gate contact 714 and drain contact 718 of the transistor 700 are disposed in a first dielectric layer 720 disposed above the substrate 501. In some embodiments, the spin orbit torque electrode 222 is disposed in a second dielectric layer 722 disposed on the first dielectric layer 720. In some embodiments, a third dielectric layer 724 is disposed on the second dielectric layer 722. In some embodiments, a fourth dielectric layer 726 is disposed on the third dielectric layer 724. In some embodiments, a source contact 716 is partially disposed in the fourth dielectric layer 726, partially disposed in the third dielectric layer 724, partially disposed in the second dielectric layer 722 and partially disposed on the first dielectric layer 720. In some embodiments, the spin orbit torque electrode contact is disposed in the third dielectric layer 724 on the spin orbit torque electrode 222. In some embodiments, the conductive interconnect structure such as conductive interconnect structure 708a/b disposed in the fourth dielectric layer 726.

In the illustrated embodiment, the gate contract 714 is formed in poly region; drain contract 718 is formed in active, poly, and Metal 0 (M0); SOT or SHE electrode 222 is formed in Via 0-1 layer; MTJ 221/321/421 is formed in Metal 1 (M1) and Via 1-2; contract 708a is formed in Metal 2 (M2) and Via 2-3; and conductor 708B is formed in Metal 3 (M3).

In some embodiments, the magnetic junction (e.g., MTJ 221/321 or spin valve) is formed in the metal 3 (M3) region. In some embodiments, the free magnet layer 421a of the magnetic junction 221/321 couples to spin Hall electrode 222. In some embodiments, the fixed magnet layer 421c of magnetic junction 221/321 couples to the bit-line (BL) via spin Hall electrode 222 through Via 3-4 (e.g., via connecting metal 4 region to metal 4 (M4)). In this example embodiments, the bit-line is formed on M4.

In some embodiments, an n-type transistor MN is formed in the frontend of the die while the spin Hall electrode 222 is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). In some embodiments, the spin Hall electrode 222 is located in the backend metal layers or via layers for example in Via 3. In some embodiments, the electrical connectivity to the device is obtained in layers M0 and M4 or M1 and M5 or any set of two parallel interconnects. In some embodiments, the MTJ 221/321 is formed in metal 2 (M2) and metal 1 (M1) layer region and/or Via 1-2 region. In some embodiments, the spin Hall electrode 222 is formed in the metal 1 region.

Figure 8A:
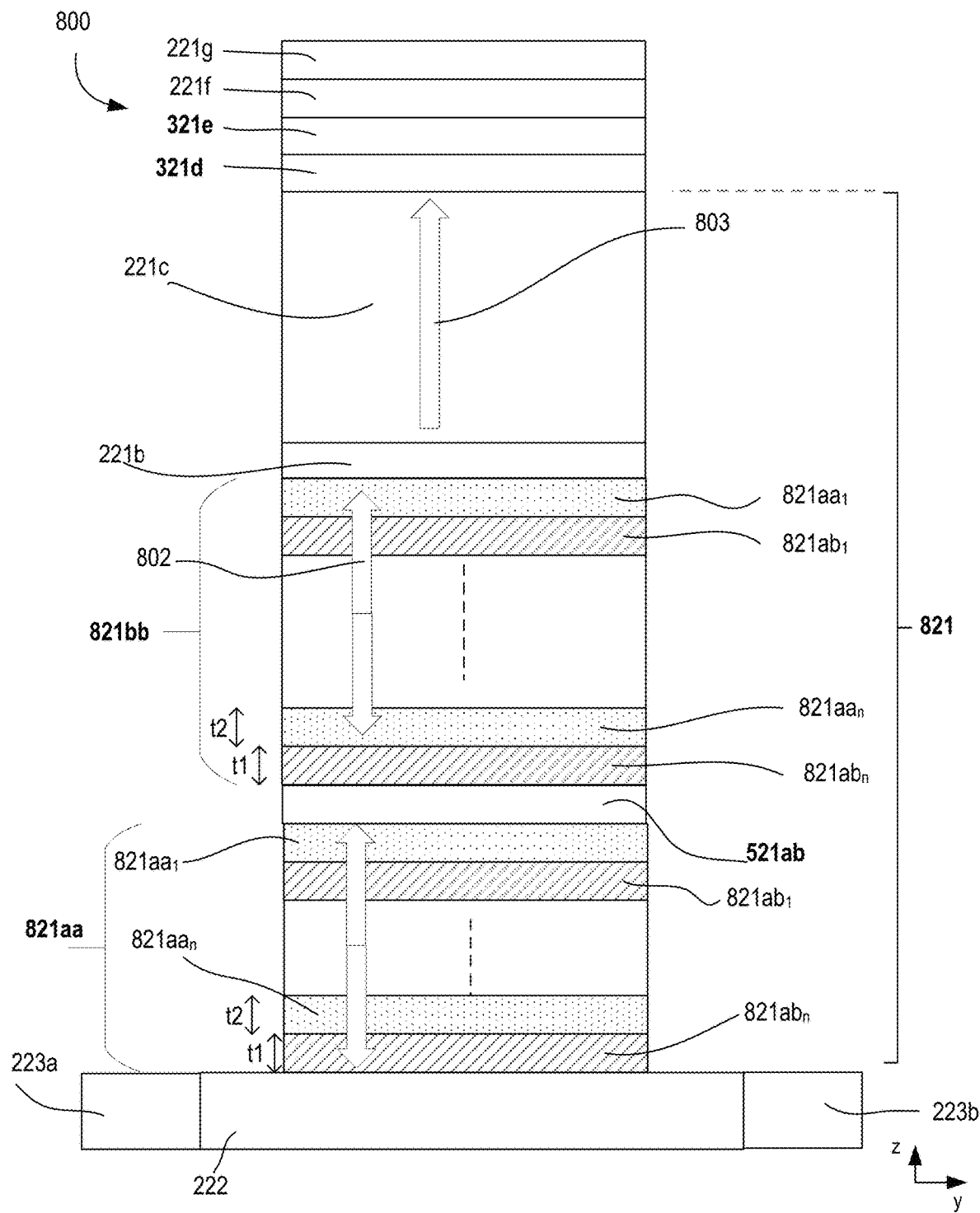
FIG. 8A illustrates a cross-section of a device having a magnetic junction with magnets having perpendicular magnetization, where a free magnet structure of the magnetic junction comprises a stack of magnets with perpendicular magnetization, where the magnetic junction stack includes an AFM structure to provide perpendicular exchange bias, according to some embodiments of the disclosure.

FIG. 8A illustrates a cross-section 800 of a device having a magnetic junction with magnets having perpendicular magnetization, where a free magnet structure of the magnetic junction comprises a stack of magnets with perpendicular magnetization, where the magnetic junction stack includes an AFM structure to provide perpendicular exchange bias, according to some embodiments of the disclosure.

The magnetic junction here is illustrated by reference sign 821 where the layers under layer 221 b (e.g., dielectric or metal/metal-oxide) together form the structure comprising the free magnet of the junction. The device of FIG. 8A is similar to the device of FIG. 3A except that the free magnets 321aa and 321ae are replaced with composite magnets having multiple layers.

In some embodiments, the composite stack of multi-layer free magnet 821aa includes 'n' layers of first material and second material. For example, the composite stack comprises layers $821aa_{1-n}$ and $821ab_{1-n}$ stacked in an alternating manner, where 'n' has a range of 1 to 10. In some embodiments, the first material includes one of: Co, Ni, Fe, or an Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t1 in a range of 0.6 nm to 2 nm. In some embodiments, the second material has a thickness t2 in a range of 0.1 nm to 3 nm. While the embodiments here show first material being at the bottom followed by the second material, the order can be reversed without changing the technical effect.

In some embodiments, composite stack of multi-layer free magnet 821bb includes 'n' layers of first material and second material. For example, the composite stack comprises layers $821aa_{1-n}$ and $821ab_{1-n}$ stacked in an alternating manner, where 'n' has a range of 1 to 10. In some embodiments, the first material includes one of: Co, Ni, Fe, or a Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t1 in a range of 0.6 nm to 2 nm. In some embodiments, the second material has a thickness t2 in a range of 0.1 nm to 3 nm. While the embodiments here show first material being at the bottom followed by the second material, the order can be reversed without changing the technical effect.

The embodiments of FIGS. 3-8 can be mixed in any order. For example, free magnet structure can be replaced with free magnets and coupling layer, a composite magnet can be replaced with a single magnet with free magnetization etc.

Figure 8B:
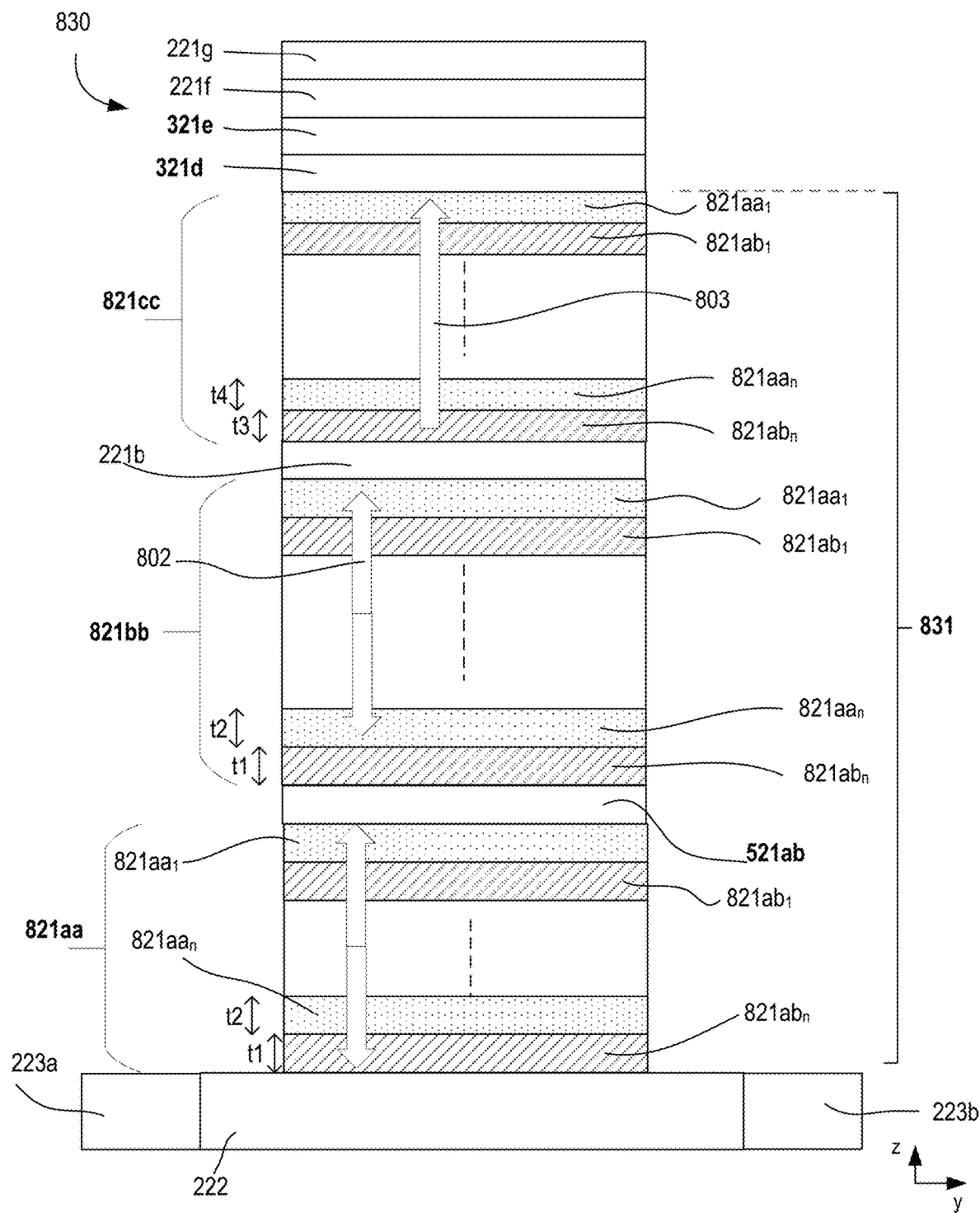
FIG. 8B illustrates a cross-section of a device having a magnetic junction with magnets having perpendicular magnetization, where a free magnet structure and a fixed magnet structure of the magnetic junction comprises a stack of magnets with perpendicular magnetization, and where the magnetic junction stack includes an AFM structure to provide perpendicular exchange bias, according to some embodiments of the disclosure.

FIG. 8B illustrates a cross-section 830 of a device having a magnetic junction with magnets having perpendicular magnetization, where a free magnet structure and a fixed magnet structure of the magnetic junction comprises a stack of magnets with perpendicular magnetization, and where the magnetic junction stack includes an AFM structure to provide perpendicular exchange bias, according to some embodiments of the disclosure. Here, fixed magnet 221c of FIG. 8A is replaced with a composite stack. As such, the magnetic junction is labeled as 831.

In some embodiments, composite stack of multi-layer fixed magnet 821cc includes 'n' layers of first material and second material. For example, the composite stack comprises layers $821aa_{1-n}$ and $821ab_{1-n}$ stacked in an alternating manner, where 'n' has a range of 1 to 10. In some embodiments, the first material includes one of: Co, Ni, Fe, or Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t3 in a range of 0.6 nm to 2 nm. In some embodiments, the second material has a thickness t4 in a range of 0.1 nm to 3 nm. While the embodiments here show the first material being at the bottom followed by the second material, the order can be reversed without changing the technical effect.

Figure 8C:
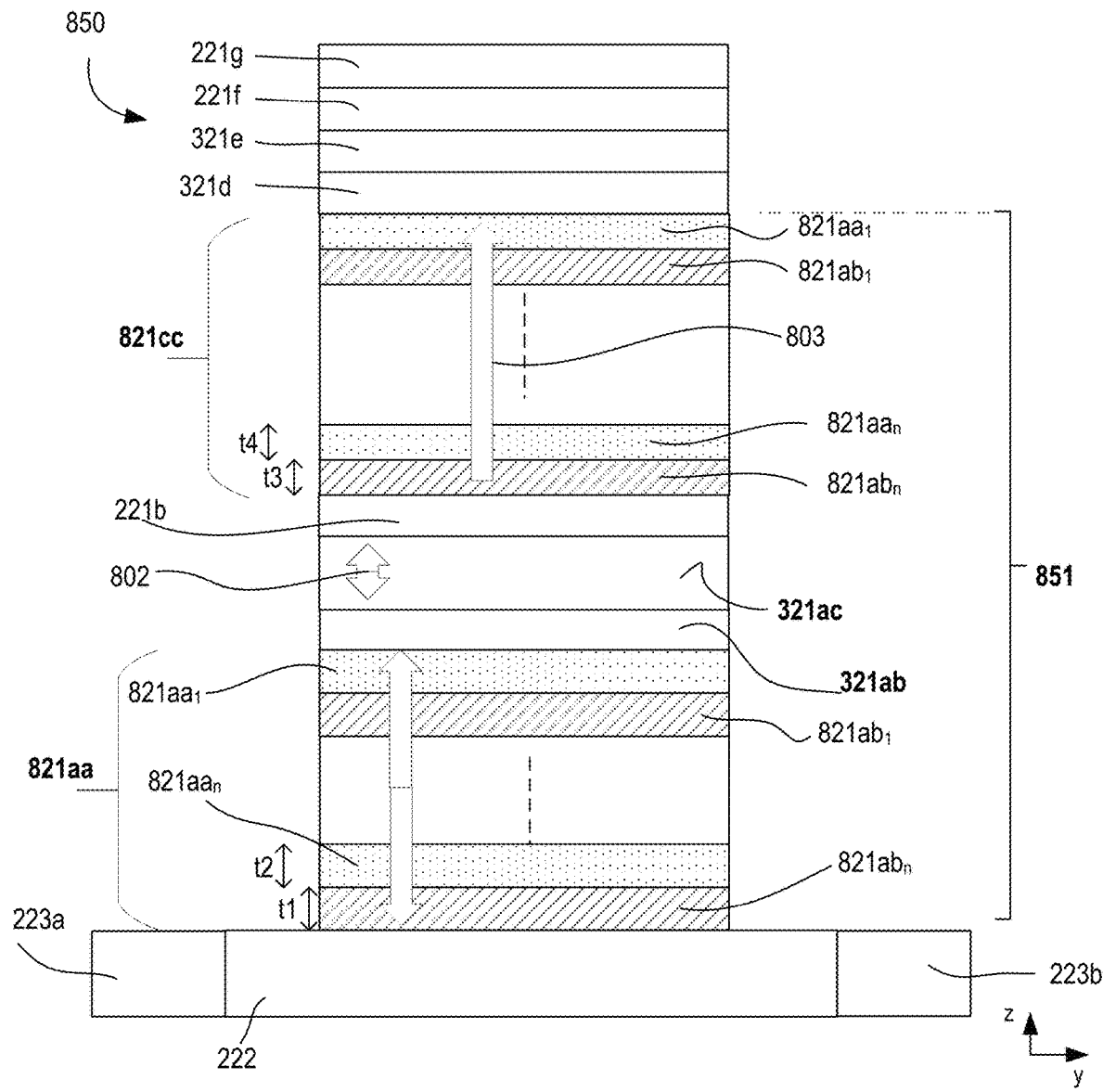
FIG. 8C illustrates a cross-section of a device having a magnetic junction with magnets having perpendicular magnetization, where a fixed magnet structure and one of the free magnets of a free magnet structure of the magnetic junction comprises a stack of magnets with perpendicular magnetization, and where the magnetic junction stack includes an AFM structure to provide perpendicular exchange bias, according to some embodiments of the disclosure.

FIG. 8C illustrates a cross-section 850 of a device having a magnetic junction with magnets having perpendicular magnetization, where a fixed magnet structure and one of the free magnets of a free magnet structure of the magnetic junction comprises a stack of magnets with perpendicular magnetization, and where the magnetic junction stack includes an AFM structure to provide perpendicular exchange bias, according to some embodiments of the disclosure. Here, free magnet 821bb of FIG. 8C is replaced with a non-composite free magnet 321ac. As such, the magnetic junction is labeled as 851.

Figure 8D:
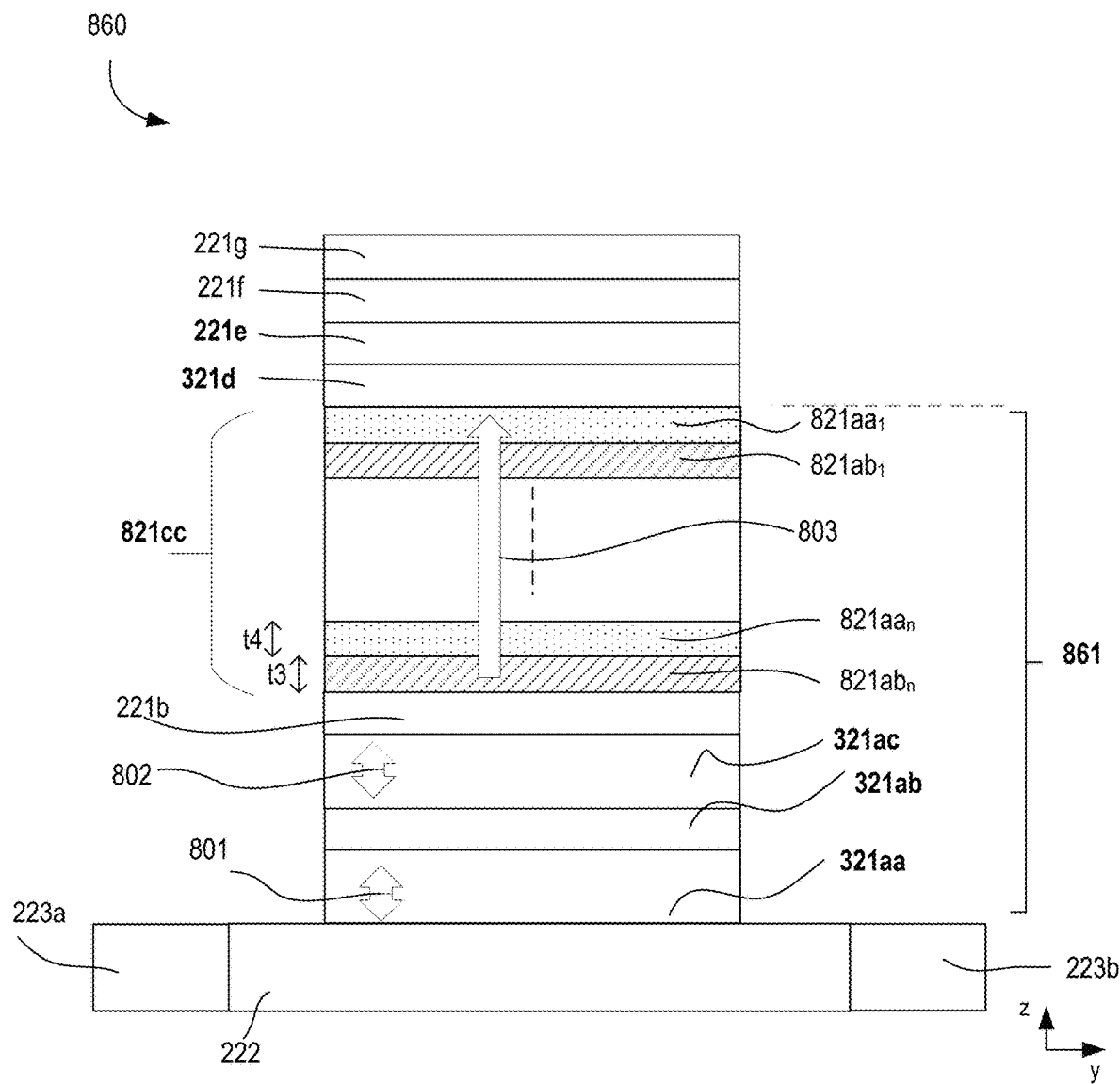
FIG. 8D illustrates a cross-section of a device having a magnetic junction with magnets having perpendicular magnetization, where a fixed magnet structure of the magnetic junction comprises a stack of magnets with perpendicular magnetization, and where the magnetic junction stack includes an AFM structure to provide perpendicular exchange bias, according to some embodiments of the disclosure.

FIG. 8D illustrates a cross-section 860 of a device having a magnetic junction with magnets having perpendicular magnetization, where a fixed magnet structure of the magnetic junction comprises a stack of magnets with perpendicular magnetization, and where the magnetic junction stack includes an AFM structure to provide perpendicular exchange bias, according to some embodiments of the disclosure. Here, free magnet 821aa of FIG. 8D is replaced with a non-composite free magnet 321aa. As such, the magnetic junction is labeled as 861.

Figure 8E:
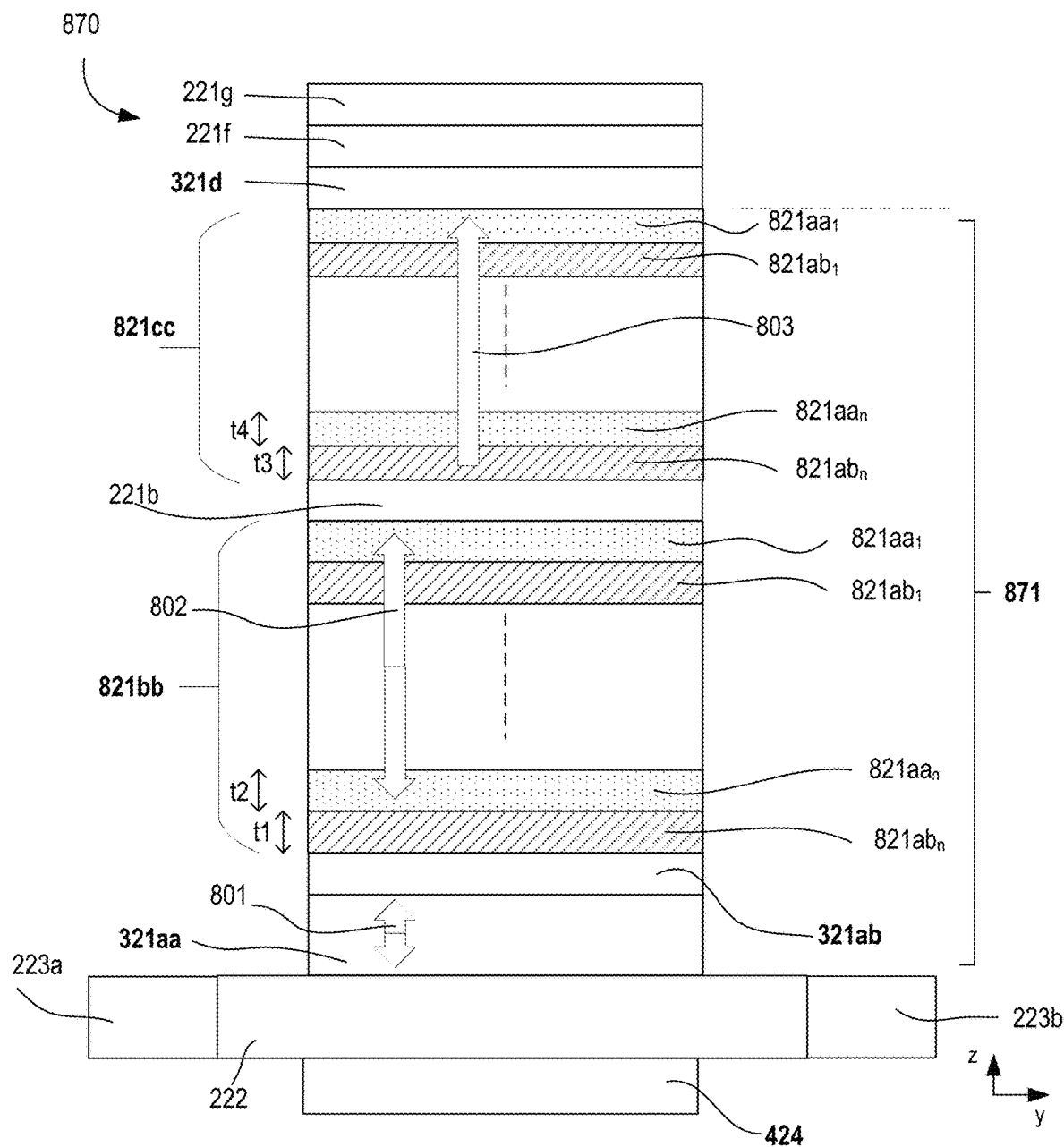
FIG. 8E illustrates a cross-section of a device having a magnetic junction with magnets having perpendicular magnetization, where a fixed magnet structure and one of the free magnets of a free magnet structure of the magnetic junction comprises a stack of magnets with perpendicular magnetization, where the magnetic junction stack includes an AFM structure to provide perpendicular exchange bias, and a via comprising a perpendicular magnet which is adjacent to the SOC interconnect, according to some embodiments of the disclosure.

FIG. 8E illustrates a cross-section 870 of a device having a magnetic junction with magnets having perpendicular magnetization, where a fixed magnet structure and one of the free magnets of a free magnet structure of the magnetic junction comprises a stack of magnets with perpendicular magnetization, where the magnetic junction stack includes an AFM structure to provide perpendicular exchange bias, and a via comprising a perpendicular magnet which is adjacent to the SOC interconnect, according to some embodiments of the disclosure. Here, free magnet 821aa of FIG. 8B is replaced with a non-composite free magnet 321aa. As such, the magnetic junction is labeled as 871.

Figure 8F:
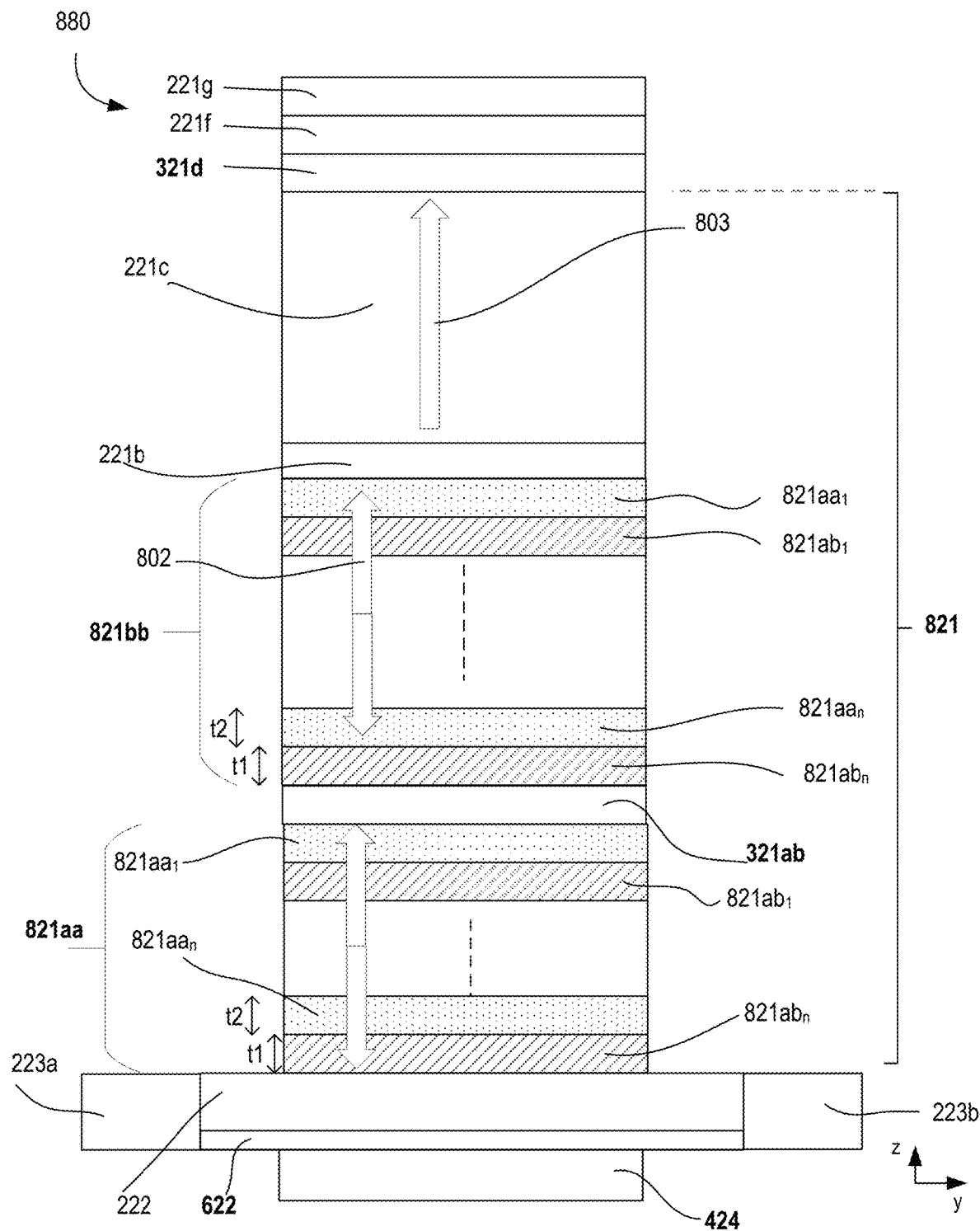
FIG. 8F illustrates a cross-section of a device having a magnetic junction with magnets having perpendicular magnetization, where a free magnet structure and a fixed magnet structure of the magnetic junction comprises a stack of magnets with perpendicular magnetization, where the magnetic junction stack includes an AFM structure to provide perpendicular exchange bias, and a via comprising a perpendicular magnet which is adjacent to an AFM embedded in the SOC interconnect, according to some embodiments of the disclosure.

FIG. 8F illustrates a cross-section 880 of a device having a magnetic junction with magnets having perpendicular magnetization, where a free magnet structure and a fixed magnet structure of the magnetic junction comprises a stack of magnets with perpendicular magnetization, where the magnetic junction stack includes an AFM structure to provide perpendicular exchange bias, and a via comprising a perpendicular magnet which is adjacent to an AFM embedded in the SOC interconnect, according to some embodiments of the disclosure. Compared to FIG. 8A here, AFM 622 is integrated in the SOC interconnect 222. Further, a compensation layer 424 is added under AFM 622.

Figure 9A:
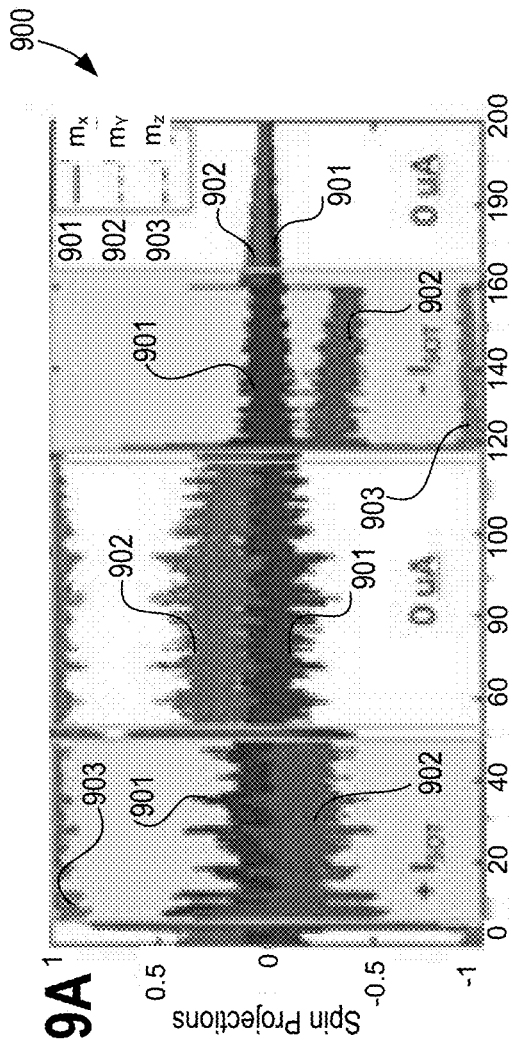
FIG. 9A illustrates a plot showing spin polarization capturing switching of a free magnet comprising a stack including a fixed magnet with in-plane magnetization positioned between free magnets with perpendicular magnetization, according to some embodiments of the disclosure.

FIG. 9A illustrates plot 900 showing spin polarization capturing switching of a free magnet structure which is exchanged coupled or biased by a magnetic via under an SOC interconnect, according to some embodiments of the disclosure. FIG. 9B illustrates a magnetization plot 920 associated with FIG. 9A, according to some embodiments of the disclosure. Plot 900 shows switching of the spin orbit torque device with PMA. Here, waveforms 901, 902, and 903 represent the magnetization projections on the x, y, and z axes, respectively. The magnet starts with z-magnetization of −1. Positive spin orbit torque (SOT) is applied from 5 ns (nanoseconds) to 50 ns. It leads to switching the z-magnetization to 1. Then, a negative spin orbit torque is applied between 120 ns and 160 ns. It leads to switching the z-magnetization to 1. This illustrates change of magnetization in response to write charge current of certain polarity.

Figure 9C:
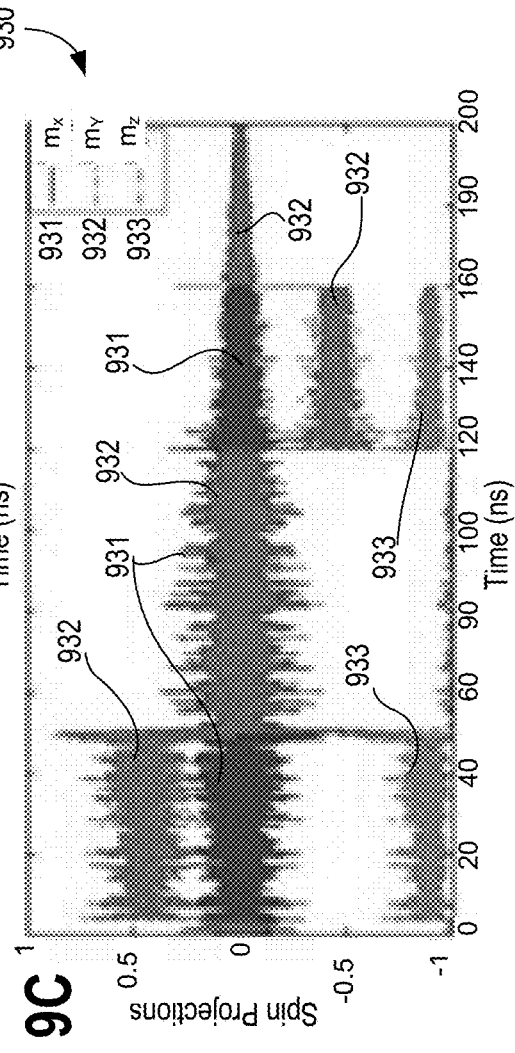
FIG. 9C illustrates a plot showing spin polarization capturing switching of the free magnet stack using spin orbit material, according to some embodiments of the disclosure.
Figure 9B:
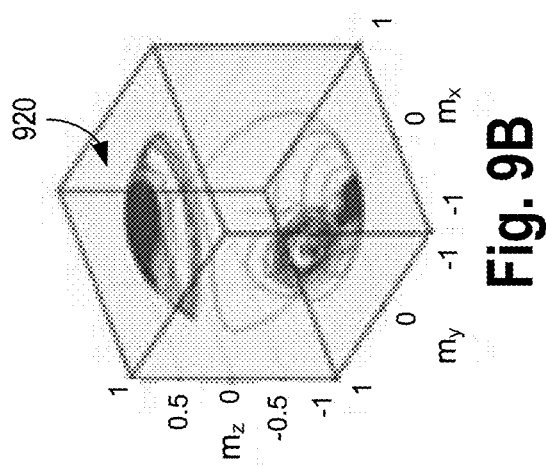
FIG. 9B illustrates a magnetization plot associated with FIG. 9A, according to some embodiments of the disclosure.
Figure 9D:
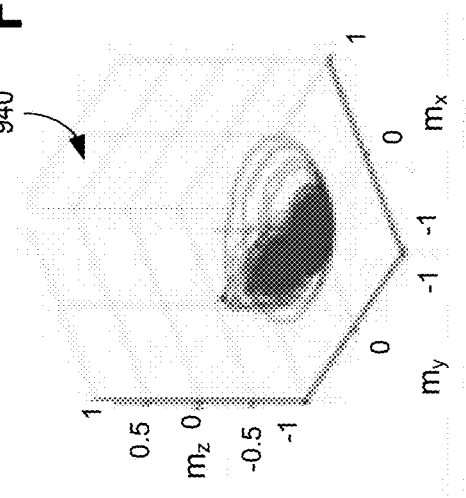
FIG. 9D illustrates a magnetization plot associated with FIG. 9C, according to some embodiments of the disclosure.

FIG. 9C illustrates plot 930 showing spin polarization capturing switching of the free magnet structure which is exchanged coupled or biased by a magnetic via under an SOC interconnect, according to some embodiments of the disclosure. FIG. 9D illustrates a magnetization plot 940 associated with FIG. 9C, according to some embodiments of the disclosure. Here, waveforms 931, 932, and 933 represent the magnetization projections on x, y, and z axes, respectively. The difference from the case of FIG. 9C is that negative spin orbit torque (SOT) is applied from 5 ns to 50 ns. As a result, the z-magnetization remains close to −1. This illustrates the persistence of magnetization in response to write charge current of opposite polarity.

Figure 10:
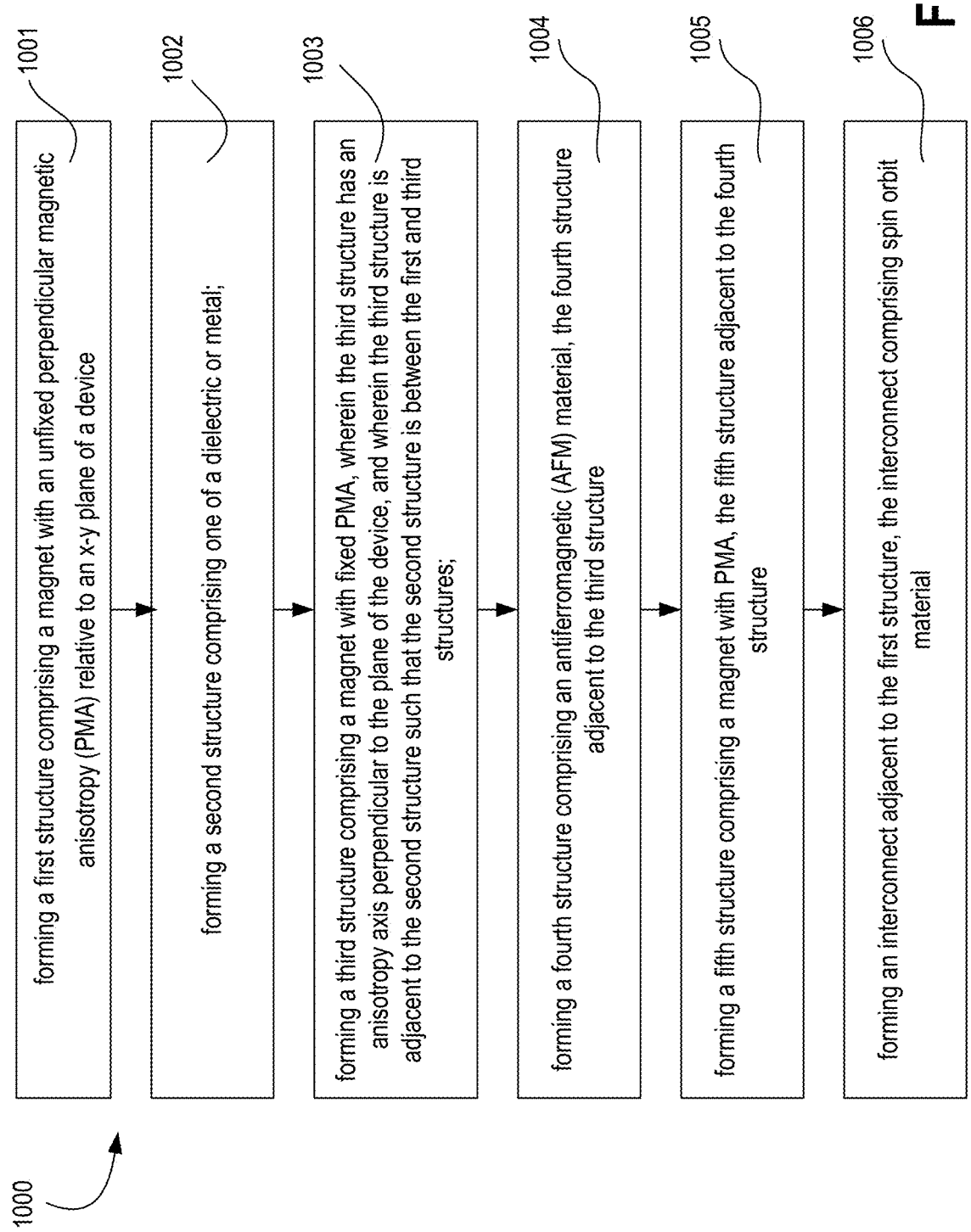
FIG. 10 illustrates a flowchart of a method for forming a memory device of any one of devices of FIGS. 3-8, in accordance with some embodiments.

FIG. 10 illustrates a flowchart 1000 of a method for forming a device of FIGS. 3-8, in accordance with some embodiments. While the following blocks (or process operations) in the flowchart are arranged in a certain order, the order can be changed. In some embodiments, some blocks can be executed in parallel.

At block 1001, a first structure (e.g., 221a) is formed. In some embodiments, forming the first magnet comprises forming a magnet with an unfixed perpendicular magnetic anisotropy (PMA) relative to an x-y plane of a device.

At block 1002, a second structure (e.g., 221b) is formed. In some embodiments, forming the second structure comprises depositing one of a dielectric or metal.

At block 1003, a third structure (e.g., 221c) is formed. In some embodiments, forming the third structure comprises forming a magnet with fixed PMA, wherein the third structure has an anisotropy axis perpendicular to the plane of the device, and wherein the third structure is adjacent to the second structure such that the second structure is between the first and third structures.

At block 1004, a fourth structure (e.g., 321d) is formed. In some embodiments, forming the fourth structure comprises an antiferromagnetic (AFM) material, the fourth structure adjacent to the third structure.

At block 1005, a fifth structure (e.g., 321e) is formed. In some embodiments, forming the fifth structure comprises forming a magnet with PMA, wherein the fifth structure is adjacent to the fourth structure, and wherein the first, second, third, fourth, and fifth structures are part of a magnetic junction device.

At block 1006, an interconnect (e.g., 222) is formed adjacent to the first structure, wherein the interconnect comprises spin orbit material.

In some embodiments, forming the magnetic junction comprises: forming a sixth structure between the first and second structures, wherein the sixth structure includes one or more of: Ru, Os, Hs, or Fe. In some embodiments, forming the magnetic junction comprises forming a seventh structure between the second and third structures, wherein the seventh structure includes one or more of: Ru, Os, Hs, or Fe. In some embodiments, the AFM material includes one of: Cr, La, Cu, Tm, Zn, Cl, F, K, N, Ir, Pt, Mn, Pd, Bi, Fe, or O. In some embodiments, the AFM material is a quasi-two-dimensional triangular AFM including $Ni_{(1-x)}M_xGa_2S_4$, where 'M' includes one of: Mn, Fe, Co or Zn. In some embodiments, the method of forming the fourth structure comprises applying one or more of: Co, Fe, Ni, Mn, Ga, or Ge.

In some embodiments, the method of forming the first and/or third structures comprises forming a stack including a first material and a second material different from the first material. In some embodiments, the method of forming the first material includes one of: Co, Ni, Fe, or Heusler alloy. In some embodiments, the Heusler alloy includes one or more of Co, Cu, Fe, Ga, Ge, In, Mn, Al, In, Sb, Si, Sn, Ni, Pd, Ru, or V. In some embodiments, the second material includes one of: Pt, Pd, Ir, Ru, or Ni. In some embodiments, the first material has a thickness in a range of 0.6 nm to 2 nm, and wherein the second material has a thickness in a range of 0.1 nm to 3 nm. In some embodiments, the dielectric comprises: Mg and O.

In some embodiments, the method of forming the first and/or the third structures comprises forming a super lattice including a first material and a second material, wherein the first material includes one of: Co, Ni, Fe, or Heusler alloy; and wherein the second material includes one of: Pt, Pd, Ir, Ru, or Ni. In some embodiments, the method of forming the first and/or third structures comprises forming a stack of three materials including a first material adjacent to the interconnect, a second material adjacent to the first material but not in contact with the interconnect, and third material adjacent to the second material and the second structure, wherein the first material includes one or more of: Co, Ni, Fe, or Heusler alloy, wherein the second material comprises Ru; and wherein the third material includes one or more of Co, Ni, Fe, or Heusler alloy.

In some embodiments, the spin orbit material includes one or more or: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe; or the spin orbit material includes one of a 2D material or a 3D material, wherein the 3D material is thinner than the 2D material. In some embodiments, the spin orbit material includes materials that exhibit Rashba-Bychkov effect.

In some embodiments, the method of forming the interconnect comprises forming a layer including an AFM material. In some embodiments, the magnetic junction is one of a spin valve or a magnetic tunneling junction (MTJ).

In some embodiments, the method of forming a memory device comprises: forming a magnetic junction (e.g., 321) having a magnet with an unfixed perpendicular magnetic anisotropy (PMA) relative to an x-y plane of a device. In some embodiments, the method further comprises forming an interconnect (e.g., 222) adjacent to the magnet of the magnetic junction, wherein the interconnect comprises a spin orbit material. In some embodiments, the method further comprises forming a structure (e.g., 424) adjacent to the interconnect such that the magnetic junction and structure are on opposite surfaces of the interconnect, wherein forming the structure comprises forming a magnet with PMA. Here, the structure is a first structure, and the method further comprises forming a second structure (e.g., 321d) comprises an antiferromagnetic (AFM) material, and wherein the second structure is adjacent to a fixed magnet (e.g., 221c) of the magnetic junction.

Figure 11:
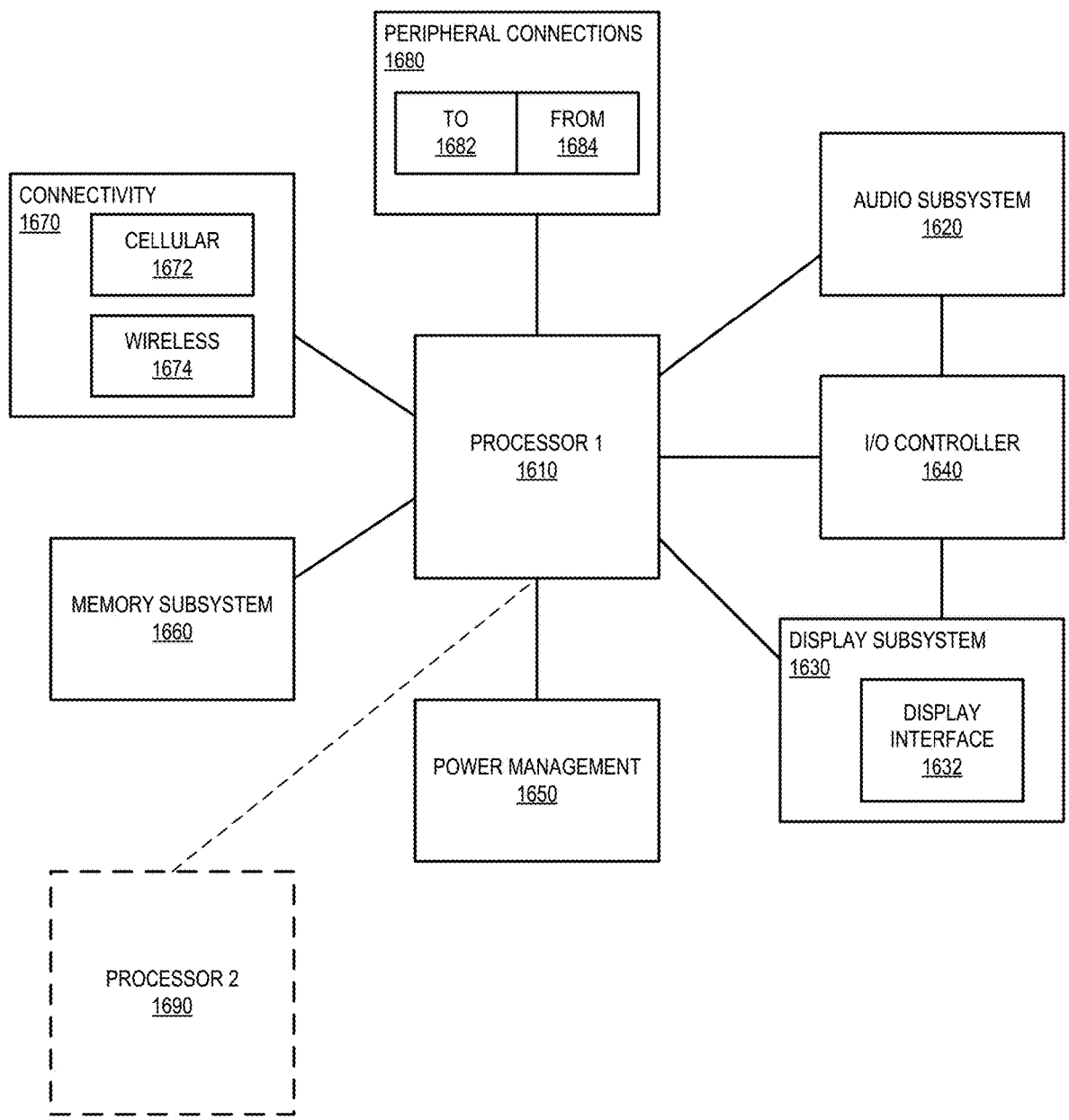
FIG. 11 illustrates a smart device or a computer system or a SoC (System-on-Chip) with a magnetic junction based memory having a magnetic junction stack including an AFM structure to provide perpendicular exchange bias, according to some embodiments of the disclosure.

FIG. 11 illustrates a smart device or a computer system or a SoC (System-on-Chip) with a magnetic junction based memory having a magnetic junction stack including an AFM structure to provide perpendicular exchange bias, according to some embodiments of the disclosure.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 11 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with one or more devices according to any one of devices of FIGS. 5-8, according to some embodiments discussed. Other blocks of the computing device 1600 may also include one or more devices according to any one of devices of FIGS. 5-8, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a magnetic junction including: a first structure comprising a magnet with an unfixed perpendicular magnetic anisotropy (PMA) relative to an x-y plane of a device; a second structure comprising one of a dielectric or metal; a third structure comprising a magnet with fixed PMA, wherein the third structure has an anisotropy axis perpendicular to the plane of the device, and wherein the third structure is adjacent to the second structure such that the second structure is between the first and third structures; a fourth structure comprising an antiferromagnetic (AFM) material, the fourth structure adjacent to the third structure; and a fifth structure comprising a magnet with PMA, the fifth structure adjacent to the fourth structure; and an interconnect adjacent to the first structure, the interconnect comprising spin orbit material.

Example 2

The apparatus of example 1, wherein the magnetic junction comprises: a sixth structure between the first and second structures, wherein the sixth structure includes one or more of: Ru, Os, Hs, or Fe.

Example 3

The apparatus of example 1, wherein the magnetic junction comprises a seventh structure between the second and third structures, wherein the seventh structure includes one or more of: Ru, Os, Hs, or Fe.

Example 4

The apparatus of example 1, wherein the AFM material includes one of: Cr, La, Cu, Tm, Zn, Cl, F, K, N, Ir, Pt, Mn, Pd, Bi, Fe, or O.

Example 5

The apparatus of example 1, wherein the AFM material is a quasi-two-dimensional triangular AFM including $Ni_{(1-x)}M_xGa_2S_4$, where 'M' includes one of: Mn, Fe, Co or Zn.

Example 6

The apparatus of example 1, wherein the fourth structure comprises one or more of: Co, Fe, Ni, Mn, Ga, or Ge.

Example 7

The apparatus of example 1, wherein: the first and/or third structures comprises a stack including a first material and a second material different from the first material; the first material includes one of: Co, Ni, Fe, or Heusler alloy; the Heusler alloy includes one or more of Co, Cu, Fe, Ga, Ge, In, Mn, Al, In, Sb, Si, Sn, Ni, Pd, Ru, or V; the second material includes one of: Pt, Pd, Ir, Ru, or Ni; and the first material has a thickness in a range of 0.6 nm to 2 nm, and wherein the second material has a thickness in a range of 0.1 nm to 3 nm.

Example 8

The apparatus of example 1, wherein the dielectric comprises: Mg and O.

Example 9

The apparatus of example 1, wherein the first and/or the third structures comprises a super lattice including a first material and a second material, wherein the first material includes one of: Co, Ni, Fe, or Heusler alloy; and wherein the second material includes one of: Pt, Pd, Ir, Ru, or Ni.

Example 10

The apparatus of example 1, wherein the first and/or third structures comprises a stack of three materials including a first material adjacent to the interconnect, a second material adjacent to the first material but not in contact with the interconnect, and third material adjacent to the second material and the second structure, wherein the first material includes one or more of: Co, Ni, Fe, or Heusler alloy, wherein the second material comprises Ru; and wherein the third material includes one or more of Co, Ni, Fe, or Heusler alloy.

Example 11

The apparatus of example 1, wherein: the spin orbit material includes one or more or: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe; or the spin orbit material includes one of a 2D material or a 3D material, wherein the 3D material is thinner than the 2D material.

Example 12

The apparatus of example 1, wherein the spin orbit material includes materials that exhibit Rashba-Bychkov effect.

Example 13

The apparatus of example 1, wherein the interconnect comprises a layer including AFM material.

Example 14

The apparatus of example 1, wherein the magnetic junction is one of a spin valve or a magnetic tunneling junction (MTJ).

Example 15

An apparatus comprising: a magnetic junction having a magnet with an unfixed perpendicular magnetic anisotropy (PMA) relative to an x-y plane of a device; an interconnect adjacent to the magnet of the magnetic junction, wherein the interconnect comprises a spin orbit material; and a structure adjacent to the interconnect such that the magnetic junction and structure are on opposite surfaces of the interconnect, wherein the structure comprises a magnet with PMA.

Example 16

The apparatus of example 15, wherein the structure is a first structure, wherein the apparatus comprises a second structure comprises an antiferromagnetic (AFM) material, and wherein the second structure is adjacent to a fixed magnet of the magnetic junction.

Example 17

The apparatus of example 15, wherein: the spin orbit material includes one or more or: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe; or the spin orbit material includes one of a 2D material or a 3D material, wherein the 3D material is thinner than the 2D material.

Example 18

The apparatus of example 15, wherein the AFM material includes one of: Cr, La, Cu, Tm, Zn, Cl, F, K, N, Ir, Pt, Mn, Pd, Bi, Fe, or O.

Example 19

A system comprising: a processor; a memory coupled to the processor, the memory including: a magnetic junction having a magnet with an unfixed perpendicular magnetic anisotropy (PMA) relative to an x-y plane of a device; an interconnect adjacent to the magnet of the magnetic junction, wherein the interconnect comprises a spin orbit material; and a structure adjacent to the interconnect such that the magnetic junction and structure are on opposite surfaces of the interconnect, wherein the structure comprises a magnet with PMA; a wireless interface to allow the processor to communicate with another device.

Example 20

The system of example 19, wherein the structure is a first structure, wherein the apparatus comprises a second structure comprises an antiferromagnetic (AFM) material, and wherein the second structure is adjacent to a fixed magnet of the magnetic junction.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a magnetic junction comprising:
        a first structure comprising a magnet with an unfixed perpendicular magnetic anisotropy (PMA) relative to a plane of the magnet;
        a second structure comprising one of a dielectric or metal;
        a third structure comprising a magnet with fixed PMA, wherein the third structure has an anisotropy axis perpendicular to the plane, and wherein the third structure is adjacent to the second structure such that the second structure is between the first and third structures;
        a fourth structure comprising an antiferromagnetic (AFM) material, the fourth structure adjacent to the third structure; and
        a fifth structure comprising a magnet with PMA, the fifth structure adjacent to the fourth structure; and
    an interconnect adjacent to the first structure, the interconnect comprising spin orbit material.

2. The apparatus of claim 1, wherein the magnetic junction comprises a sixth structure between the first and second structures, wherein the sixth structure comprises one or more of Ru, Os, Hs, or Fe.

3. The apparatus of claim 1, wherein the magnetic junction comprises a sixth structure between the second and third structures, wherein the sixth structure comprises one or more of Ru, Os, Hs, or Fe.

4. The apparatus of claim 1, wherein the AFM material comprises one of Cr, La, Cu, Tm, Zn, Cl, F, K, N, Ir, Pt, Mn, Pd, Bi, Fe, or O.

5. The apparatus of claim 1, wherein the AFM material is a quasi-two-dimensional triangular AFM comprising $Ni_{(1-x)}M_xGa_2S_4$, where 'M' comprises one of Mn, Fe, Co or Zn.

6. The apparatus of claim 1, wherein the fourth structure comprises one or more of Co, Fe, Ni, Mn, Ga, or Ge.

7. The apparatus of claim 1, wherein:
    the first and/or third structures comprises a stack comprising a first material and a second material different from the first material;
    the first material comprises one of Co, Ni, Fe, or Heusler alloy;
    the Heusler alloy comprises one or more of Co, Cu, Fe, Ga, Ge, In, Mn, Al, In, Sb, Si, Sn, Ni, Pd, Ru, or V;
    the second material comprises one of: Pt, Pd, Jr, Ru, or Ni; and
    the first material has a thickness in a range of 0.6 nm to 2 nm, and the second material has a thickness in a range of 0.1 nm to 3 nm.

8. The apparatus of claim 1, wherein the dielectric comprises Mg and O.

9. The apparatus of claim 1, wherein the first and/or the third structures comprises a super lattice comprising a first material and a second material, wherein the first material comprises one of Co, Ni, Fe, or Heusler alloy, and wherein the second material comprises one of Pt, Pd, Jr, Ru, or Ni.

10. The apparatus of claim 1, wherein the first and/or third structures comprises a stack of three materials comprising a first material adjacent to the interconnect, a second material adjacent to the first material but not in contact with the interconnect, and third material adjacent to the second material and the second structure, wherein the first material comprises one or more of Co, Ni, Fe, or Heusler alloy, wherein the second material comprises Ru, and wherein the third material comprises one or more of Co, Ni, Fe, or Heusler alloy.

11. The apparatus of claim 1, wherein:
    the spin orbit material comprises one or more of β-Tantalum (β-Ta), Ta, β-Tungsten (β-W), W, Platinum (Pt), Copper (Cu) doped with elements including one of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Jr, Mn, Pd, or Fe; or
    the spin orbit material comprises one of a 2D material or a 3D material.

12. The apparatus of claim 1, wherein the spin orbit material comprises materials that exhibit Rashba-Bychkov effect.

13. The apparatus of claim 1, wherein the interconnect comprises a layer comprising AFM material.

14. The apparatus of claim 1, wherein the magnetic junction is one of a spin valve or a magnetic tunneling junction (MTJ).

15. An apparatus comprising:
    a magnetic junction comprising a magnet with an unfixed perpendicular magnetic anisotropy (PMA) relative to a plane of the magnet;
    an interconnect adjacent to the magnet of the magnetic junction, wherein the interconnect comprises a spin orbit material; and
    a structure adjacent to the interconnect such that the magnetic junction and structure are on opposite surfaces of the interconnect, wherein the structure comprises a magnet with PMA.

16. The apparatus of claim 15, wherein the structure is a first structure, wherein the apparatus comprises a second structure comprising an antiferromagnetic (AFM) material, and wherein the second structure is adjacent to a fixed magnet of the magnetic junction.

17. The apparatus of claim 16, wherein the AFM material comprises one of Cr, La, Cu, Tm, Zn, Cl, F, K, N, Ir, Pt, Mn, Pd, Bi, Fe, or O.

18. The apparatus of claim 15, wherein:
the spin orbit material comprises one or more of β-Tantalum (β-Ta), Ta, β-Tungsten (β-W), W, Platinum (Pt), Copper (Cu) doped with elements including one of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe; or
the spin orbit material comprises one of a 2D material or a 3D material.

19. A system comprising:
a processor;
a memory coupled to the processor, the memory comprising:
  a magnetic junction comprising a magnet with an unfixed perpendicular magnetic anisotropy (PMA) relative to a plane of the magnet;
  an interconnect adjacent to the magnet of the magnetic junction, wherein the interconnect comprises a spin orbit material; and
  a structure adjacent to the interconnect such that the magnetic junction and structure are on opposite surfaces of the interconnect, wherein the structure comprises a magnet with PMA; and
a wireless interface to allow the processor to communicate with another device.

20. The system of claim 19, wherein the structure is a first structure, wherein the apparatus comprises a second structure comprising an antiferromagnetic (AFM) material, and wherein the second structure is adjacent to a fixed magnet of the magnetic junction.

* * * * *